US007419868B2

(12) United States Patent
Ou et al.

(10) Patent No.: US 7,419,868 B2
(45) Date of Patent: Sep. 2, 2008

(54) GATED DIODE NONVOLATILE MEMORY PROCESS

(75) Inventors: Tien Fan Ou, Taipei (TW); Wen Jer Tsai, Hualien (TW); Erh-Kun Lai, Longjing Shiang (TW); Hsuan Ling Kao, Taipei (TW)

(73) Assignee: Macronix International Co., Ltd., Hsinchu (TW)

( * ) Notice: Subject to any disclaimer, the term of this patent is extended or adjusted under 35 U.S.C. 154(b) by 27 days.

(21) Appl. No.: 11/619,082

(22) Filed: Jan. 2, 2007

(65) Prior Publication Data
US 2008/0116499 A1    May 22, 2008

Related U.S. Application Data

(60) Provisional application No. 60/866,583, filed on Nov. 20, 2006.

(51) Int. Cl.
*H01L 21/8234* (2006.01)
(52) U.S. Cl. ........................ 438/237; 438/288; 438/328; 257/288; 257/544; 257/E21.053; 257/E21.351; 257/E21.662

(58) Field of Classification Search .................. 438/208, 438/235, 356; 257/E21.053, E21.351, E21.352, 257/E21.362, E21.363, E21.364, E21.366, 257/E21.368, E21.372, E21.374, E21.613, 257/E21.662, 121, 367
See application file for complete search history.

(56) References Cited

U.S. PATENT DOCUMENTS

| 5,814,853 | A | 9/1998 | Chen |
| 6,180,444 | B1 * | 1/2001 | Gates et al. .................. 438/237 |
| 6,690,601 | B2 | 2/2004 | Yeh et al. |
| 2006/0073657 | A1 * | 4/2006 | Herner et al. ............... 438/237 |
| 2007/0131999 | A1 | 6/2007 | Tsai et al. |
| 2007/0133273 | A1 | 6/2007 | Liao et al. |

* cited by examiner

*Primary Examiner*—Scott B. Geyer
*Assistant Examiner*—Cheung Lee
(74) *Attorney, Agent, or Firm*—Kenta Suzue; Haynes Beffel & Wolfeld LLP

(57) ABSTRACT

A gated diode nonvolatile memory cell with a charge storage structure includes a diode structure with an additional gate terminal. Various embodiments may include or exclude a diffusion barrier structure between the diode nodes. Example embodiments include the individual memory cell, an array of such memory cells, methods of operating the memory cell or array of memory cells, and methods of manufacturing the same.

28 Claims, 52 Drawing Sheets

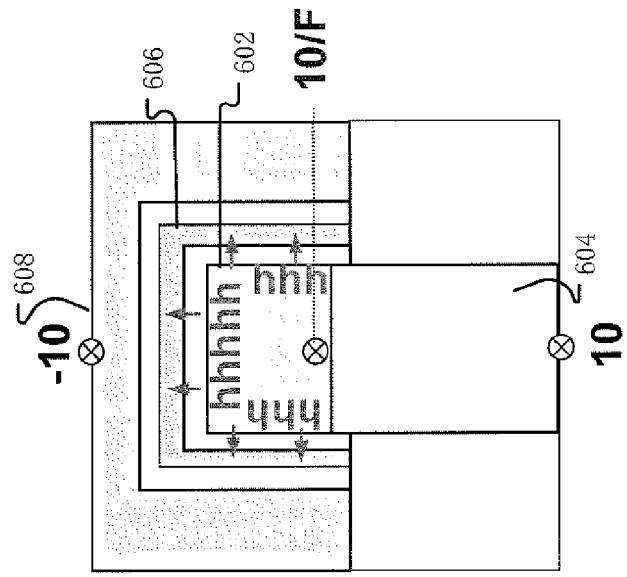
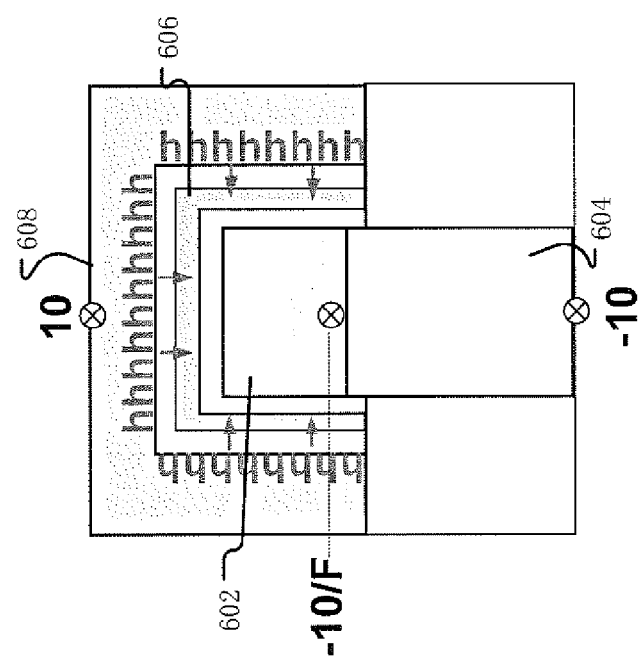
Fig. 8B
Fig. 8A

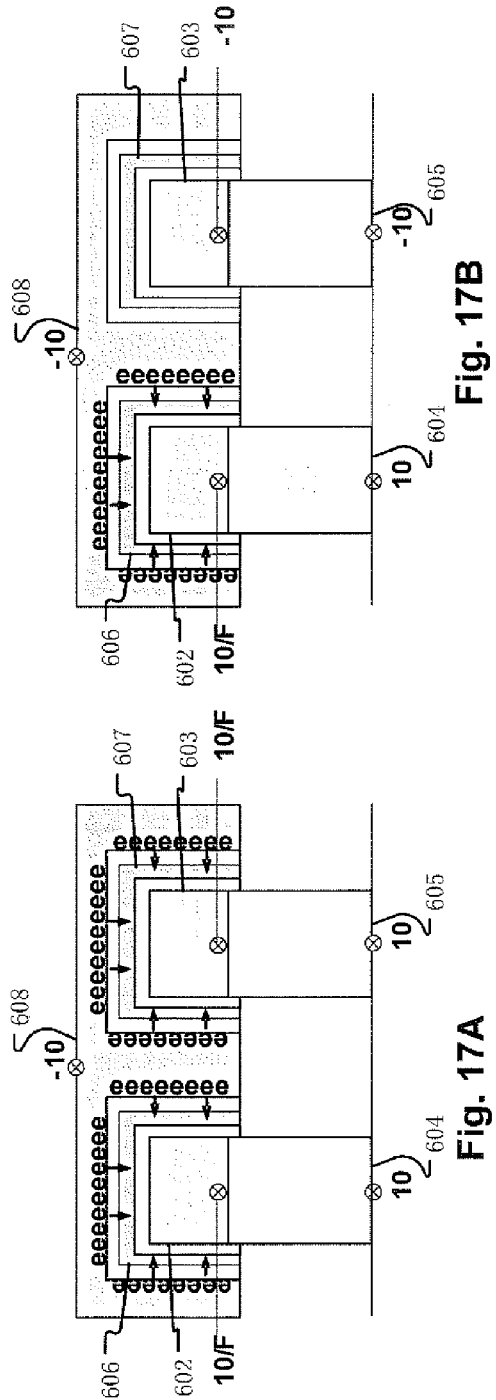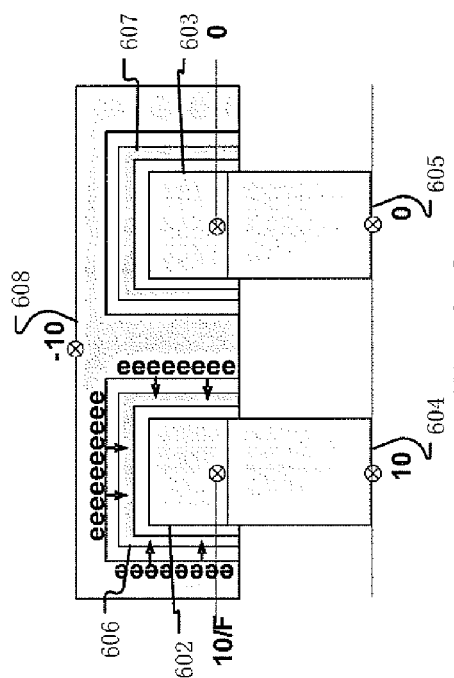
Fig. 17A
Fig. 17B
Fig. 17C

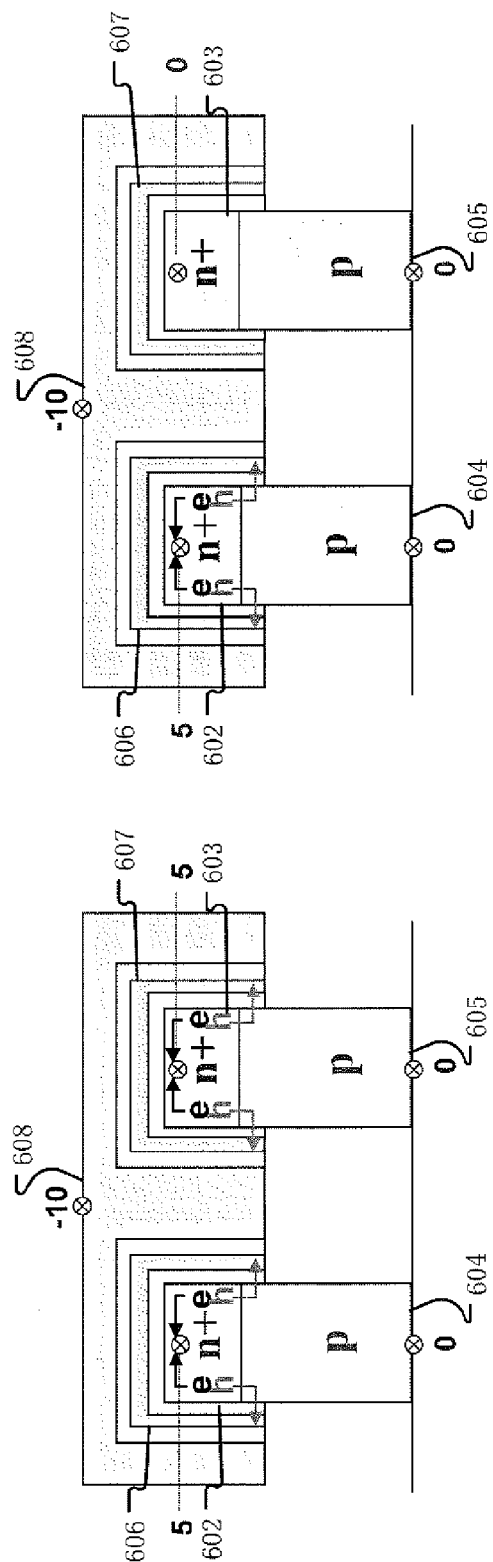

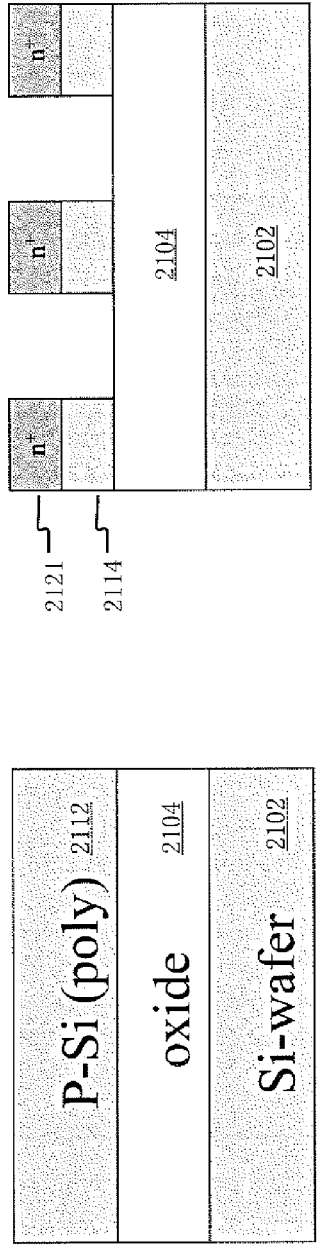
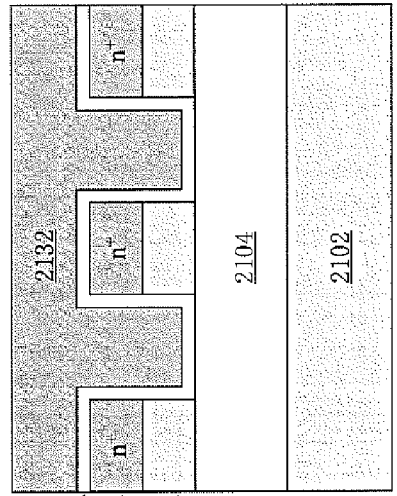
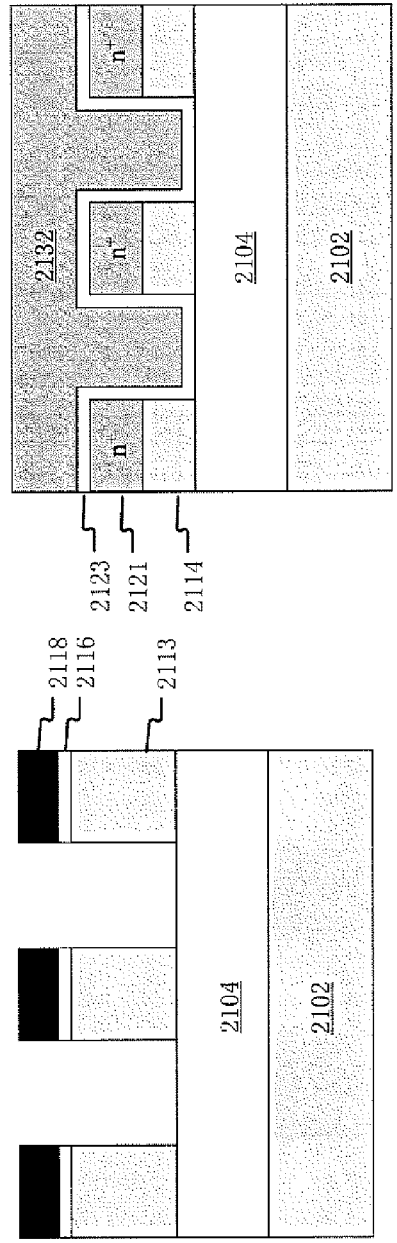
Fig. 21C
Fig. 21D
Fig. 21A
Fig. 21B

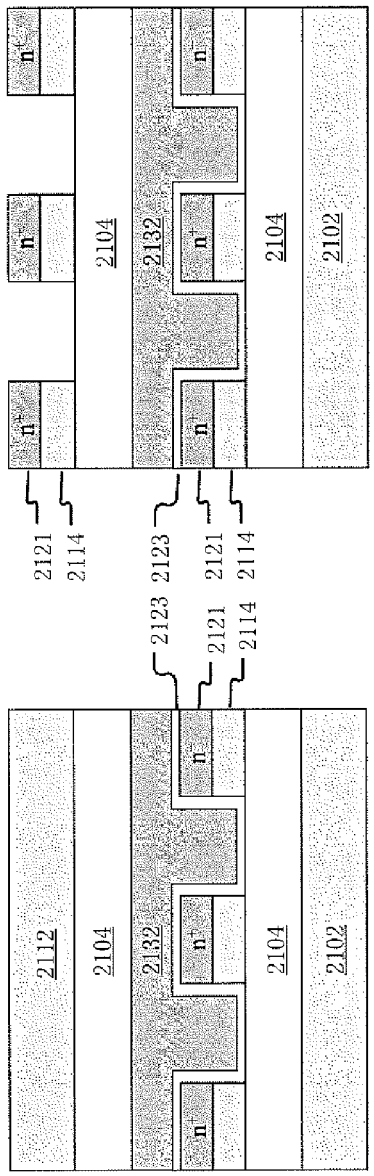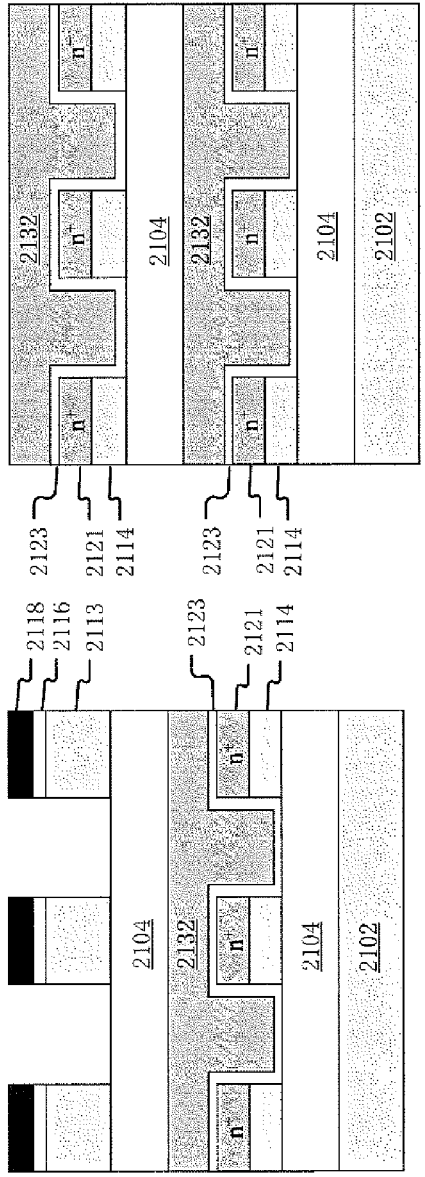

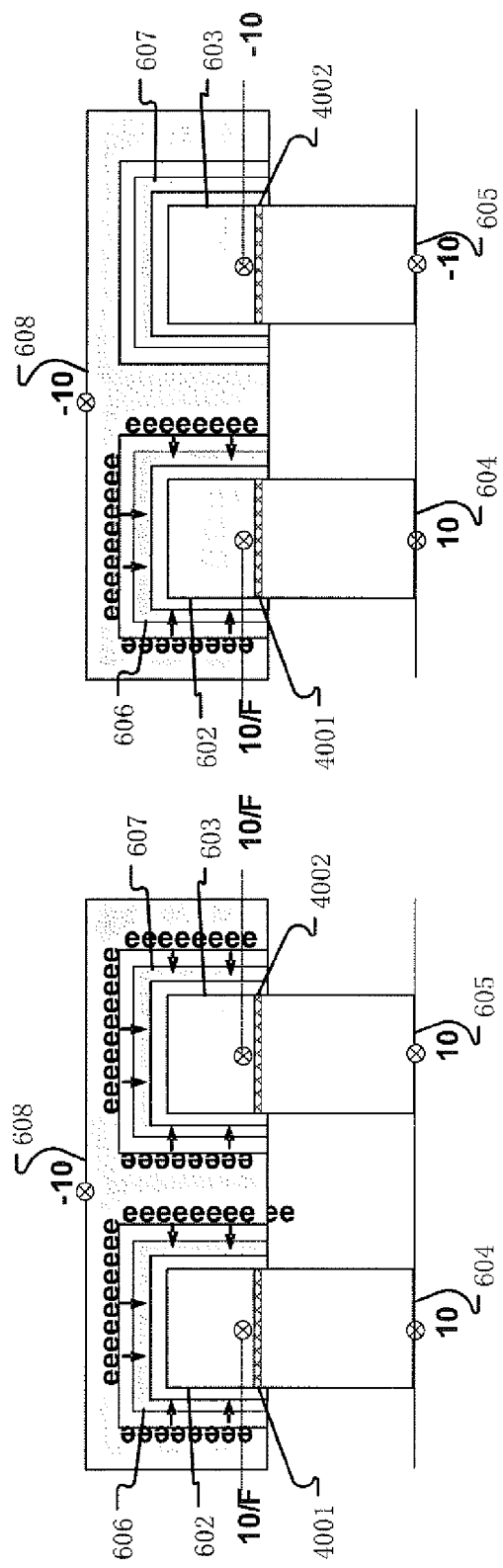

GATED DIODE NONVOLATILE MEMORY PROCESS

REFERENCE TO RELATED APPLICATION

This application claims the benefit of U.S. Provisional Patent Application No. 60/866,583, filed on 20 Nov. 2006, by inventors Tien-Fan Ou, Wen-Jer Tsai, Erh-Kun Lai, Hsuan-Ling Kao and Yi Ying Liao entitled Gated Diode Nonvolatile Memory.

BACKGROUND

1. Field

The present invention relates to electrically programmable and erasable non-volatile memory, and more particularly to charge storage memory with a bias arrangement that reads the contents of the charge storage structure of the memory cell with great sensitivity.

2. Description of Related Art

Electrically programmable and erasable non-volatile memory technologies based on charge storage structures known as EEPROM and flash memory are used in a variety of modern applications. A number of memory cell structures are used for EEPROM and flash memory. As the dimensions of integrated circuits shrink, greater interest is arising for memory cell structures based on charge trapping dielectric layers, because of the scalability and simplicity of the manufacturing processes. Various memory cell structures based on charge trapping dielectric layers include structures known by the industry names PHINES, NROM, and SONOS, for example. These memory cell structures store data by trapping charge in a charge trapping dielectric layer, such as silicon nitride. As more net negative charge is trapped, the threshold voltage of the memory cell increases. The threshold voltage of the memory cell is reduced by removing negative charge from, or adding positive charge to, the charge trapping layer.

Conventional memory cell structures rely on a transistor structure with source, drain, and gate. However, common transistor structures have drain and source diffusions that are laterally separated from each other by a self-aligned gate. This lateral separation is a factor that resists further miniaturization of nonvolatile memory.

Thus, a need exists for a nonvolatile memory cell that is open to further miniaturization and whose contents can be read with great sensitivity.

SUMMARY

One aspect of the technology is a method for making a nonvolatile memory device in an integrated circuit, such that the device includes a diode having a first diode node and a second diode node. The diode in various embodiments is any of: a Schottky diode and a pn diode. Various method embodiments include the following steps:

forming a first layer of a first charge type of the integrated circuit above a second layer of a second charge type of the integrated circuit. The first charge type is opposite to the second charge type.

removing part of the first layer and part of the second layer to form the first diode node in the first layer and to form the second diode node in the second layer. The first charge type of the first diode node is opposite to the second charge type of the second diode node. In various embodiments, the first diode node is any of: doped polysilicon, and part of a bit line accessing the device; and the second diode node is any of: a well of the integrated circuit, a substrate of the integrated circuit. Also, the first diode node and second diode node are at least one of monocrystal, polycrystal, and amorphous. The first diode node and the second diode node are separated by a junction. In various embodiments, the junction is any of: a homojunction, a heterojunction, and a graded heterojunction. In some embodiments, the junction includes a diffusion barrier junction.

forming isolation dielectric areas of the integrated circuit to isolate at least part of the second diode node of the device from neighboring devices, such that the isolation dielectric areas leave the junction uncovered. In some embodiments, this is performed by: covering at least the junction with the isolation dielectric areas, and removing at least the isolation dielectric areas covering the junction.

forming a charge storage structure and one or more storage dielectric structures on the integrated circuit. The charge storage structure is any of: charge trapping material, floating gate material, and nanocrystal material. The charge storage structure and the one or more storage dielectric structures cover at least the junction and parts of the first and second diode nodes adjacent to the junction. The one or more storage dielectric structures are at least partly between the charge storage structure and the first and second diode nodes. The one or more storage dielectric structures are at least partly between the charge storage structure and a source of gate voltage of the device. In some embodiments, the charge storage structure has a charge storage state determined by a measurement of current flowing through the first diode node and the second diode node in reverse bias.

forming the gate supplying the gate voltage of the device.

Another aspect of the technology is a nonvolatile memory device in an integrated circuit. The device includes a diode having a first diode node and a second is diode node as described herein, and the device is made by a process as described herein.

A further aspect of the technology is a method for making an array of nonvolatile memory devices in an integrated circuit. Each of the devices includes a diode having a first diode node and a second diode node as described herein. Various method embodiments comprise the following steps:

forming a first layer of a first charge type of the integrated circuit above a second layer of a second charge type of the integrated circuit. The first charge type is opposite to the second charge type.

removing part of the first layer and part of the second layer to form the first diode nodes in the first layer and to form the second diode nodes in the second layer. The devices each include an adjacent pair of the first diode node and the second diode node. The first diode node and the second diode node of each of the devices are separated by a junction. In some embodiments, the first diode nodes are bit lines, and the bit lines and the word lines access particular nonvolatile memory devices of the array of nonvolatile memory devices.

forming isolation dielectric columns of the integrated circuit to isolate at least part of the second diode node of each of the devices from neighboring columns of the devices, The junction of each of the devices is covered by the isolation dielectric columns.

forming a charge storage structure and one or more storage dielectric structures for each of the devices. The charge storage structure and the one or more storage dielectric structures cover at least the junction and parts of the first and second diode nodes adjacent to the junction. The one or more storage dielectric structures are at least partly between the charge storage structure and the first and second diode nodes, and the one or more storage dielectric structures are at least partly between the charge storage structure and a source of gate voltage of each of the devices.

forming word lines supplying the gate voltage to each of the devices of the integrated circuit.

Further embodiments are described herein, such as with regard to each cell.

Another aspect of the technology is an array of nonvolatile memory devices in an integrated circuit. Each of the devices includes a diode having a first diode node and a second diode node as described herein. The array made by a process as described herein.

BRIEF DESCRIPTION OF THE DRAWINGS

FIGS. 8A and 8B are simplified diagrams of a gated diode nonvolatile memory cell operation performing hole tunnel injection.

FIGS. 17A, 17B, and 17C are simplified diagrams of neighboring gated diode nonvolatile memory cells without interconnected second nodes, in which electron tunnel injection is performed on selected cells.

FIGS. 18A, 18B and 18C are simplified diagrams of neighboring gated diode nonvolatile memory cells without interconnected second nodes, in which band-to-band hot hole injection is performed on selected cells.

FIGS. 21A-21H illustrate a sample process flow for multiple arrays of gated diode nonvolatile memory cells.

FIGS. 40A and 40B are similar to the simplified diagrams in FIGS. 17A and 17B of neighboring gated diode nonvolatile memory cells without interconnected second nodes, in which electron tunnel injection is performed on selected cells, but add a diffusion barrier junction to the diode structure.

DETAILED DESCRIPTION

Figure 1:
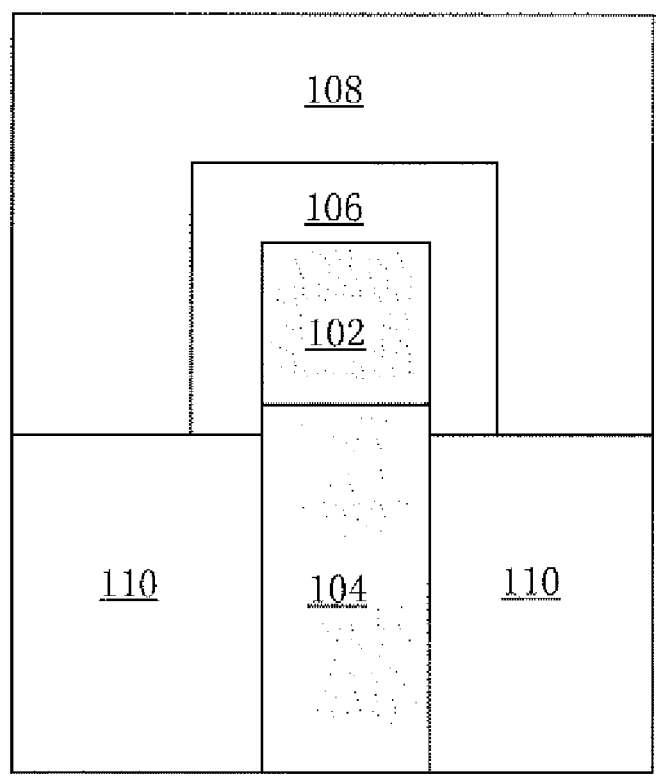
FIG. 1 is a simplified diagram of a gated diode nonvolatile memory cell.

FIG. 1 is a simplified diagram of a gated diode nonvolatile memory cell. Nodes 102 and 104 form a diode separated by a junction. A combined charge storage and dielectric structure 106 substantially surrounds the first diode node 102. The combined charge storage and dielectric structure 106 is also partly adjacent to the second diode node 104. In this cross-sectional view, dielectric 110 on either side of the second diode node 104 isolates the second diode node 104 from neighboring devices, such as other gated diode nonvolatile memory cells.

Figure 25:
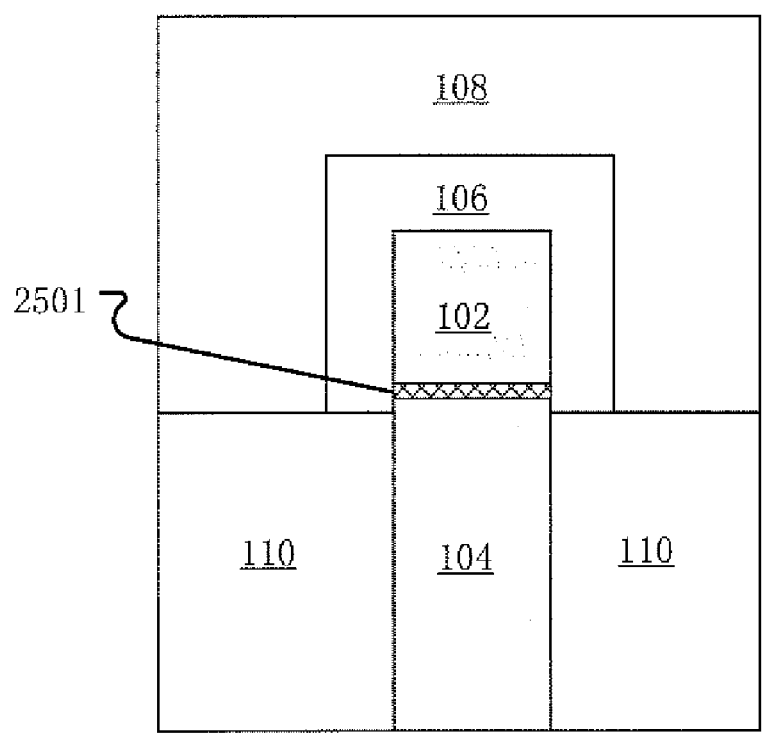
FIG. 25 is similar to the simplified diagram in FIG. 1 of a gated diode nonvolatile memory cell, but adds a diffusion barrier junction to the diode structure.

FIG. 25 is similar to the simplified diagram in FIG. 1 of a gated diode nonvolatile memory cell, but adds a diffusion barrier junction to the diode structure.

Figure 2C:
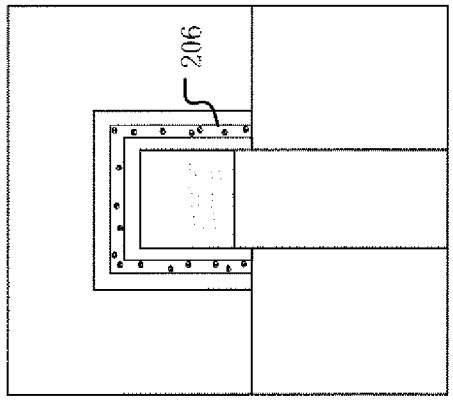
FIGS. 2A, 2B, and 2C are simplified diagrams of a gated diode nonvolatile memory cell, showing various charge storage structures having different materials.
Figure 2B:
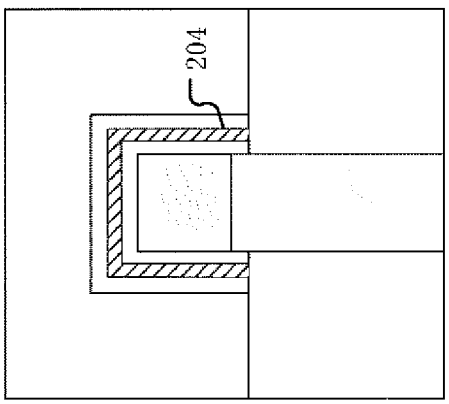
Figure 2A:
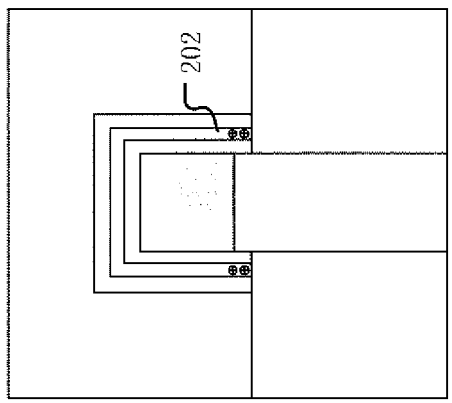

FIGS. 2A, 2B and 2C are simplified diagrams of a gated diode nonvolatile memory cell, showing various charge storage structures having different materials. In FIG. 2A, a charge trapping material structure 202 locally stores charge, schematically shown here as positive charge on the portion of the charge trapping material near the diode junction. Oxide structures are between the charge trapping material structure 202 and the gate structure, and between the charge trapping material structure 202 and the diode structure. Representative dielectrics between the charge trapping material structure 202 and the gate structure include silicon dioxide and silicon oxynitride having a thickness of about 5 to 10 nanometers, or other similar high dielectric constant materials including for example $Al_2O_3$. Representative between the charge trapping material structure 202 and the diode structure include silicon dioxide and silicon oxynitride having a thickness of about 2 to 10 nanometers, or other similar high dielectric constant materials.

Representative charge trapping structures include silicon nitride having a thickness of about 3 to 9 nanometers, or other similar high dielectric constant materials, including metal oxides such as $Al_2O_3$, $HfO_2$, and others.

In some embodiments, the gate structure comprises a material having a work function greater than the intrinsic work function of n-type silicon, or greater than about 4.1 eV, and preferably greater than about 4.25 eV, including for example greater than about 5 eV. Representative gate materials include p-type poly, TiN, Pt, and other high work function metals and materials. Other materials having a relatively high work function suitable for embodiments of the technology include metals including but not limited to Ru, Ir, Ni, and Co, metal alloys including but not limited to Ru—Ti and Ni—T, metal nitrides, and metal oxides including but not limited to $RuO_2$. High work function gate materials result in higher injection barriers for electron tunneling than that of the typical n-type polysilicon gate. The injection barrier for n-type polysilicon gates with silicon dioxide as the outer dielectric is around 3.15 eV. Thus, embodiments of the present technology use materials for the gate and for the outer dielectric having an injection barrier higher than about 3.15 eV, such as higher than about 3.4 eV, and preferably higher than about 4 eV. For p-type polysilicon gates with silicon dioxide outer dielectrics, the injection barrier is about 4.25 eV, and the resulting threshold of a converged cell is reduced about 2 volts relative to a cell having an n-type polysilicon gate with a silicon dioxide outer dielectric.

FIG. 2B shows a gated diode nonvolatile memory cell resembling the gated diode nonvolatile memory cell of FIG. 2A, but with a floating gate 204, often made of polysilicon. FIG. 2C shows a gated diode nonvolatile memory cell resembling the nonvolatile memory cell of FIG. 2A, but with a nanoparticle charge storage structure 206.

Each charge storage structure can store one bit or multiple bits. For example, if each charge storage structure stores two bits, then there are four discrete levels of charge stored by the gated diode nonvolatile memory cell.

In some embodiments, programming refers to making more positive the net charge stored in the charge trapping structure, such as by the addition of holes to or the removal of electrons from the charge storage structure; and erasing refers to making more negative the net charge stored in the charge storage structure, such as by the removal of holes from or the addition of electrons to the charge trapping structure. However, in other embodiments programming refers to making the net charge stored in the charge storage structure more negative, and erasing refers to making the net charge stored in the charge storage structure more positive. Various charge movement mechanisms are used, such as band-to-band tunneling induced hot carrier injection, E-field induced tunneling, and direct tunneling from the substrate.

Figure 26C:
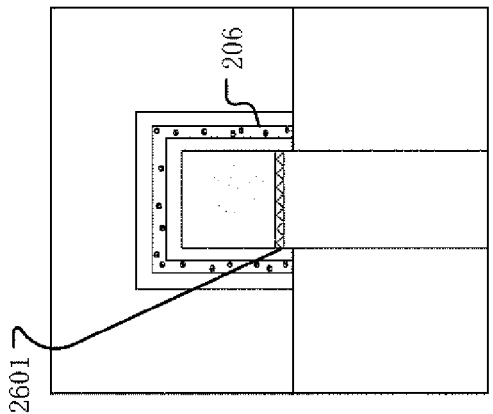
FIGS. 26A, 26B, and 26C are similar to the simplified diagrams in FIGS. 2A, 2B, and 2C of a gated diode nonvolatile memory cell, showing various charge storage structures having different materials, but add a diffusion barrier junction to the diode structure.
Figure 26B:
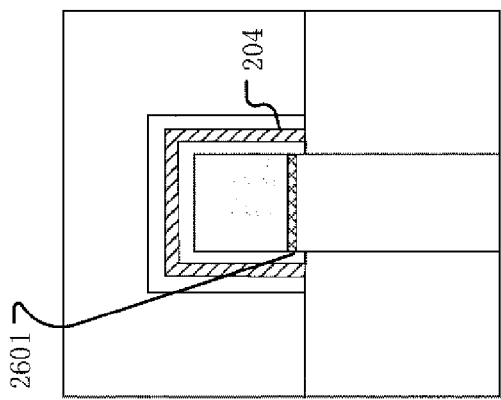
Figure 26A:
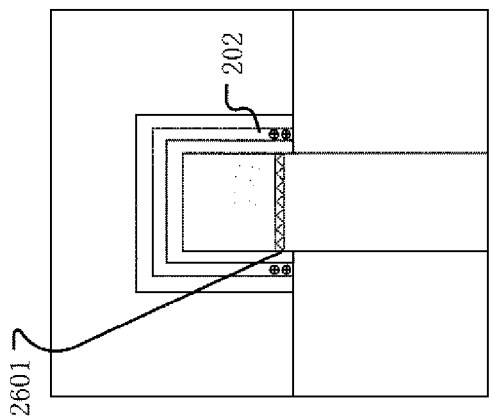
Figure 27D:
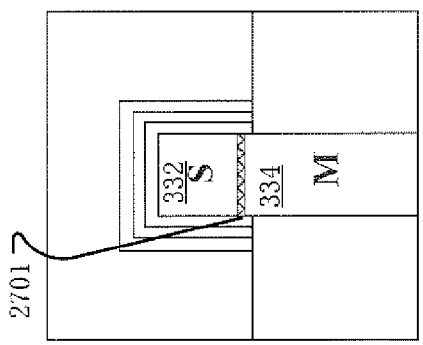
FIGS. 27A, 27B, 27C, and 27D are similar to the simplified diagrams in FIGS. 3A, 3B, 3C, and 3D of a gated diode nonvolatile memory cell, showing various examples of a diode structure, such as the pn diode and the Schottky diode, but add a diffusion barrier junction to the diode structure.
Figure 27C:
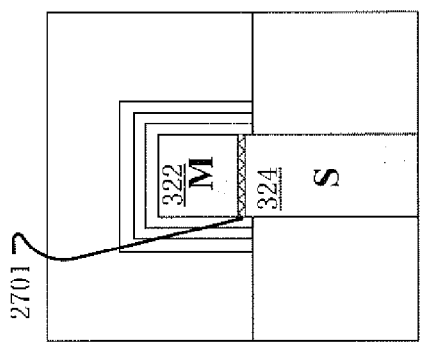
Figure 27B:
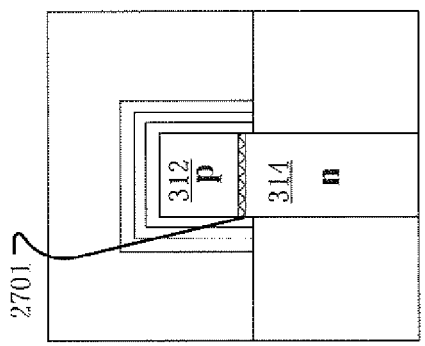
Figure 27A:
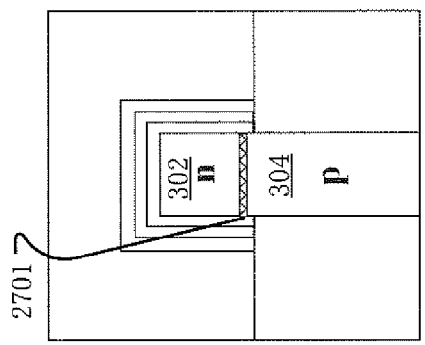

FIGS. 26A, 26B, and 26C are similar to the simplified diagrams in FIGS. 2A, 2B, and 2C of a gated diode nonvolatile memory cell, showing various charge storage structures having different materials, but add a diffusion barrier junction to the diode structure.

Figure 3D:
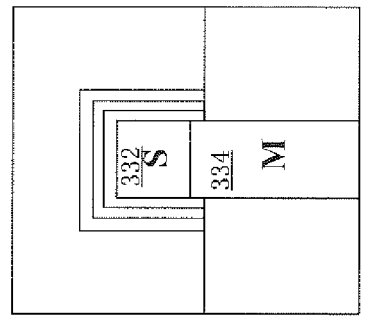
FIGS. 3A, 3B, 3C, and 3D are simplified diagrams of a gated diode nonvolatile memory cell, showing various examples of a diode structure, such as the pn diode and the Schottky diode.
Figure 3C:
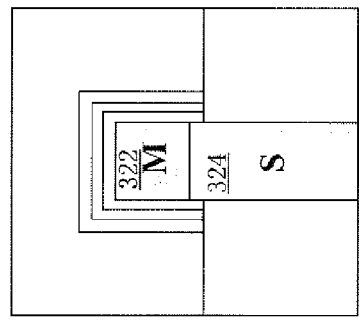
Figure 3B:
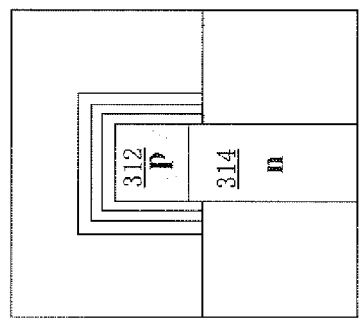
Figure 3A:
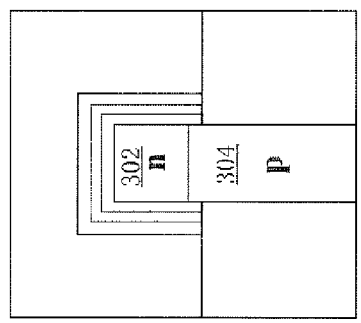

FIGS. 3A, 3B, 3C, and 3D are simplified diagrams of a gated diode nonvolatile memory cell, showing various examples of a diode structure, such as the pn diode and the Schottky diode. In FIGS. 3A and 3B, the diode structure is a pn diode. In FIG. 3A, the first node 302 substantially surrounded by the combined charge storage and dielectric structure is doped n-type, and the second node 304 is doped p-type. The gated diode nonvolatile memory cell of FIG. 3B interchanges the node materials of FIG. 3A, such that the first node 312 substantially surrounded by the combined charge storage and dielectric structure is doped p-type, and the second node 314 is doped n-type. In FIGS. 3C and 3D, the diode structure is a Schottky diode. In FIG. 5C, the first node 322 substantially surrounded by the combined charge storage and dielectric structure is a metal material, and the second node 324 is a semiconductor material. The gated diode nonvolatile memory cell of FIG. 3D interchanges the node materials of FIG. 3C, such that the first node 332 substantially surrounded by the combined charge storage and dielectric structure is a semiconductor material, and the second node 334 is a metal material.

FIGS. 27A, 27B, 27C, and 27D are similar to the simplified diagrams in FIGS. 3A, 3B, 3C, and 3D of a gated diode nonvolatile memory cell, showing various examples of a diode structure, such as the pn diode and the Schottky diode, but add a diffusion barrier junction to the diode structure.

Figure 4B:
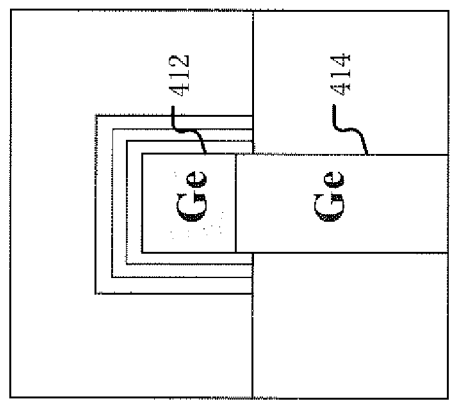
FIGS. 4A and 4B are simplified diagrams of a gated diode nonvolatile memory cell, showing examples of a pn diode with a homojunction.
Figure 4A:
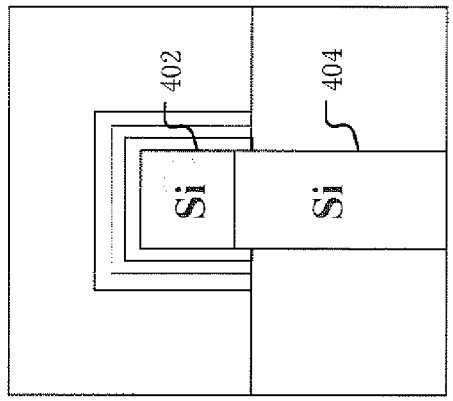

FIGS. 4A and 4B are simplified diagrams of a gated diode nonvolatile memory cell, showing examples of a pn diode with a homojunction. In FIG. 4A, both the first node 402 and the second 404 of the diode structure are silicon. In FIG. 4B, both the first node 412 and the second 414 of the diode structure are germanium. Because of the smaller bandgap of germanium compared to silicon, the gated diode nonvolatile memory cell tends to generate a greater band-to-band current with the configuration of FIG. 4B than with the configuration of FIG. 4A. Regardless of the material used in the homojunction diode structure, the diode structure can be single crystal or polycrystalline. A polycrystalline design results in higher memory cell density, due to the ability to deposit multiple layers of memory cells in the vertical direction.

Figure 28B:
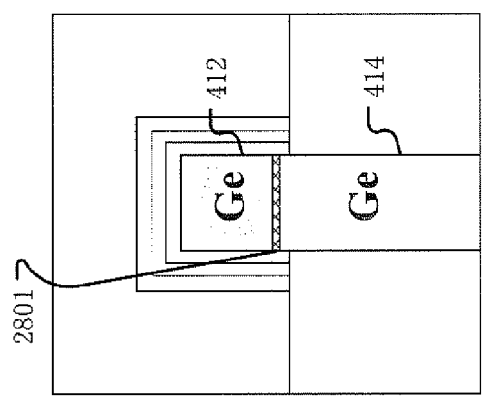
FIGS. 28A and 28B are similar to the simplified diagrams in FIGS. 4A and 4B of a gated diode nonvolatile memory cell, showing examples of a pn diode with a homojunction, but add a diffusion barrier junction to the diode structure.
Figure 28A:
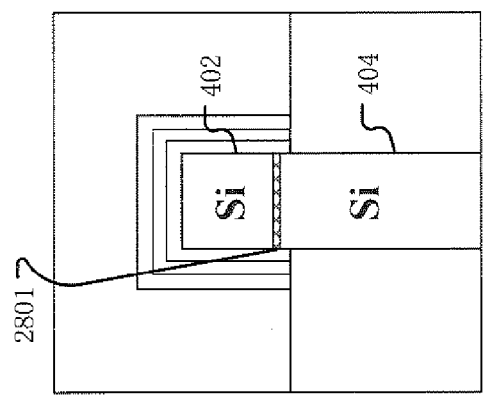

FIGS. 28A and 28B are similar to the simplified diagrams in FIGS. 4A and 4B of a gated diode nonvolatile memory cell, showing examples of a pn diode with a homojunction, but add a diffusion barrier junction to the diode structure.

Figure 5:
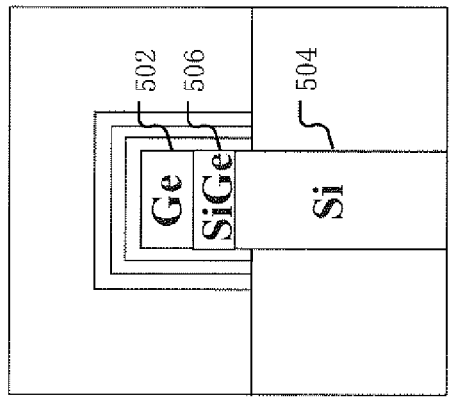
FIG. 5 is a simplified diagram of a gated diode nonvolatile memory cell, showing an example of a pn diode with a heterojunction.

FIG. 5 is a simplified diagram of a gated diode nonvolatile memory cell, showing an example of a pn diode with a heterojunction. The first node 502 substantially surrounded by the combined charge storage and dielectric structure is germanium. The second node 504 is silicon. The first node 502 and the second node 504 are joined by a graded transition layer junction 506.

Figure 29:
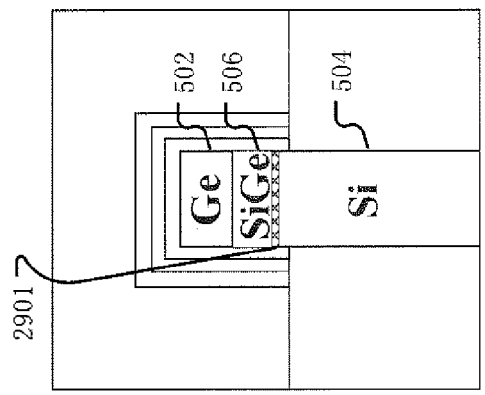
FIG. 29 is similar to the simplified diagram in FIG. 5 of a gated diode nonvolatile memory cell, showing an example of a pn diode with a heterojunction, but adds a diffusion barrier junction to the diode structure.

FIG. 29 is similar to the simplified diagram in FIG. 5 of a gated diode nonvolatile memory cell, showing an example of a pn diode with a heterojunction, but adds a diffusion barrier junction to the diode structure.

Figure 6B:
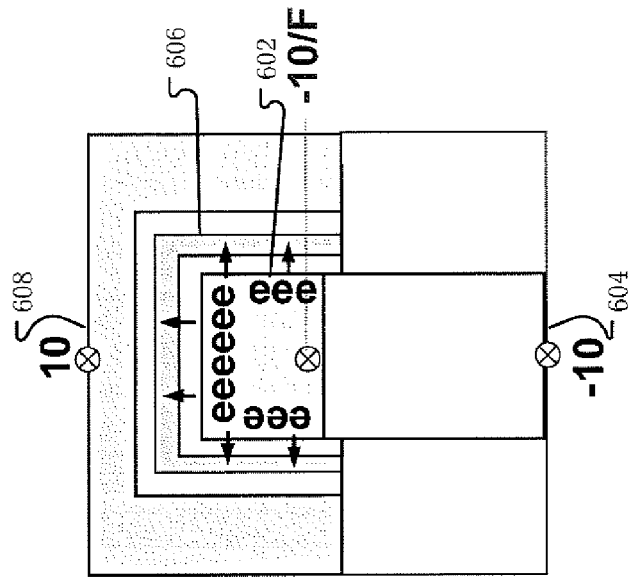
FIGS. 6A and 6B are simplified diagrams of a gated diode nonvolatile memory cell operation performing electron tunnel injection.
Figure 6A:
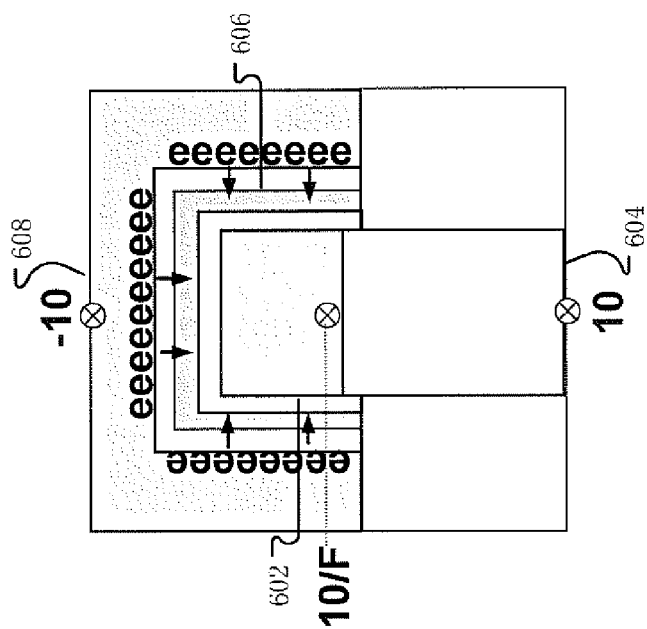

FIGS. 6A and 6B are simplified diagrams of a gated diode nonvolatile memory cell operation performing electron tunnel injection. In FIG. 6A, the electron tunnel injection mechanism moves electrons from the gate structure 608 biased at −10 V to the charge storage structure 606. The first diode node is biased at 10 V or is floating, and the second diode node 604 is biased at 10 V. In FIG. 6B, the electron tunnel injection mechanism moves electrons from the first diode node 602 biased at −10 V or is floating, to the charge storage structure 606. The gate structure 608 is biased at 10 V, and the second diode node 604 is biased at −10 V.

Figure 33B:
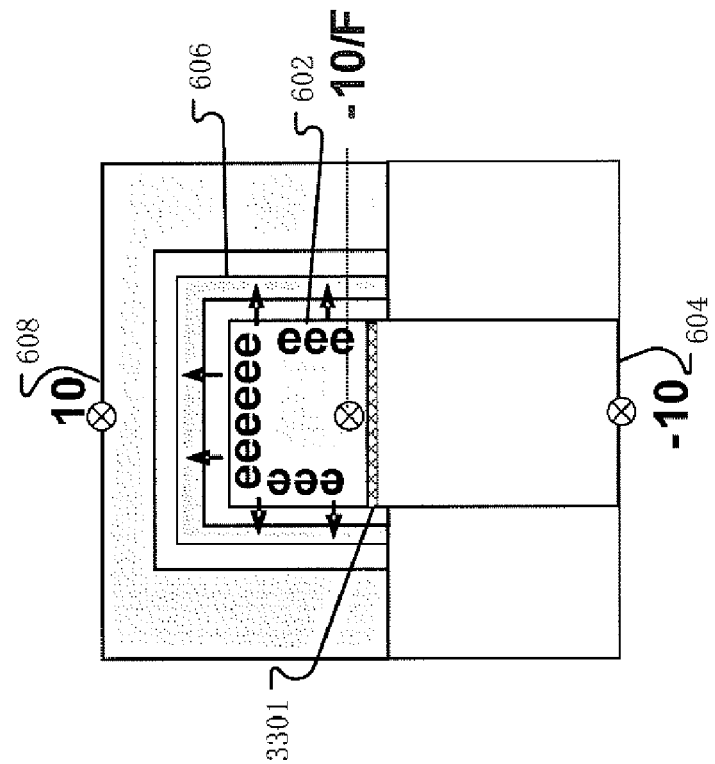
FIGS. 33A and 33B are similar to the simplified diagrams in FIGS. 6A and 6B of a gated diode nonvolatile memory cell operation performing electron tunnel injection, but add a diffusion barrier junction to the diode structure.
Figure 33A:
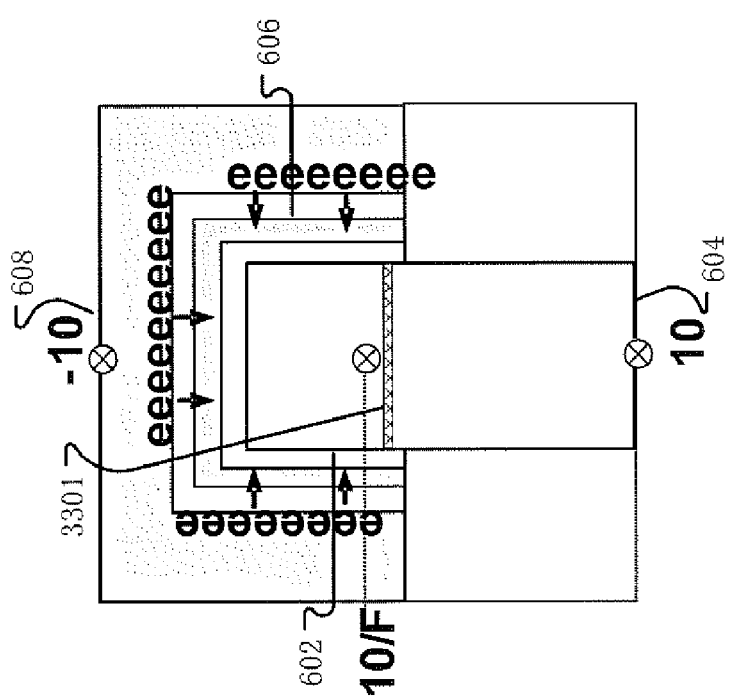

FIGS. 33A and 33B are similar to the simplified diagrams in FIGS. 6A and 6B of a gated diode nonvolatile memory cell operation performing electron tunnel injection, but add a diffusion barrier junction to the diode structure.

Figure 7B:
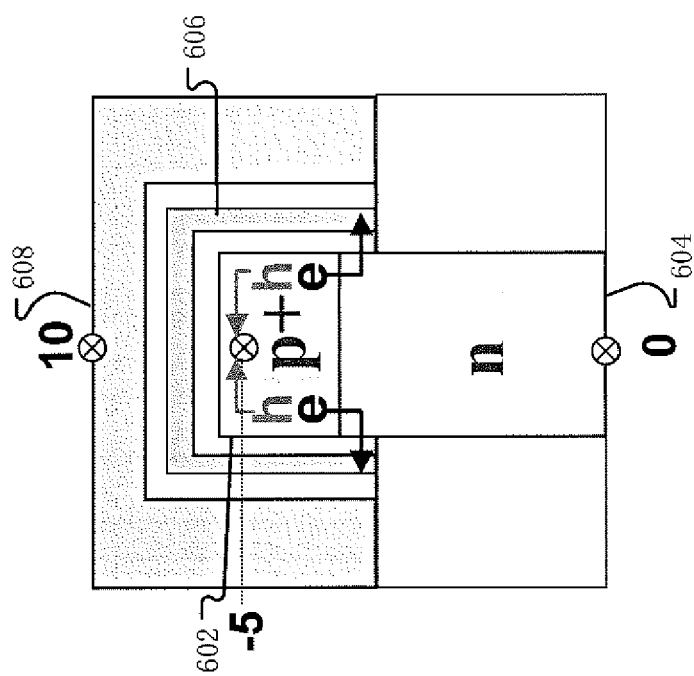
FIGS. 7A and 7B are simplified diagrams of a gated diode nonvolatile memory cell operation performing band-to-band hot electron injection.
Figure 7A:
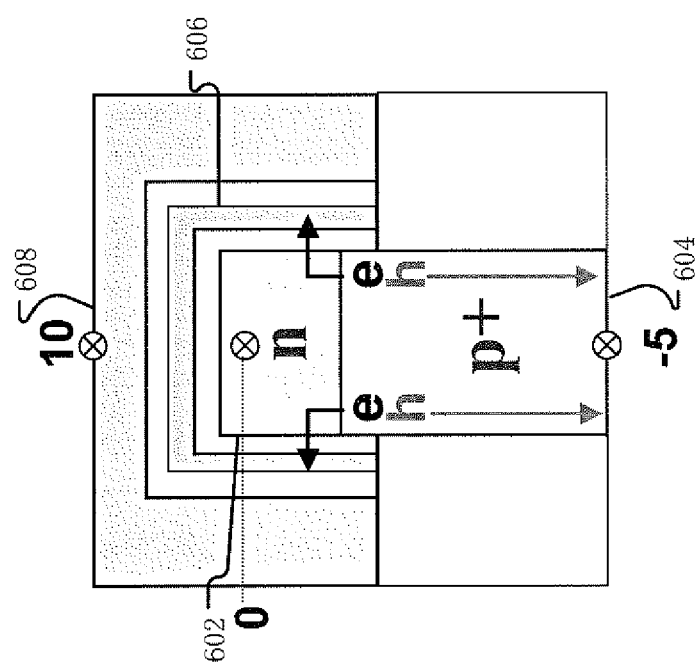

FIGS. 7A and 7B are simplified diagrams of a gated diode nonvolatile memory cell operation performing band-to-band hot electron injection. In FIG. 7A, the band-to-band hot electron injection moves electrons from the diode structure to the charge storage structure 606. The n-type first diode node 602 biased at 0 V, the gate structure 608 is biased at 10 V, and holes of the resulting electron-hole pairs flow into the p+-type second node 604 biased at −5 V. In FIG. 7B, the band-to-band hot electron injection moves electrons from the diode structure to the charge storage structure 606. The n-type second diode node 604 biased at 0 V, the gate structure 608 is biased at 10 V, and holes of the resulting electron-hole pairs flow into the p+-type first node 602 is biased at −5 V.

Figure 34B:
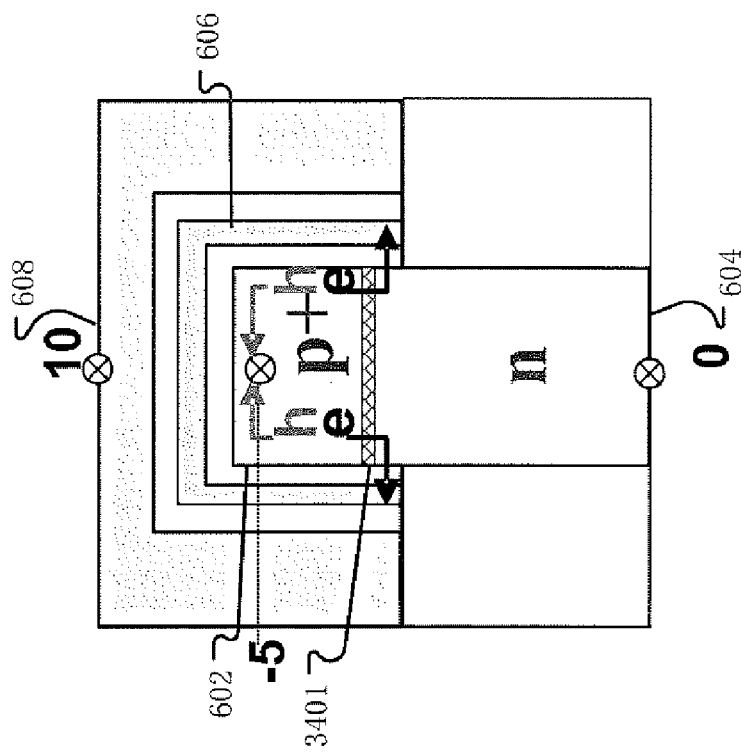
FIGS. 34A and 34B are similar to the simplified diagrams in FIGS. 7A and 7B of a gated diode nonvolatile memory cell operation performing band-to-band hot electron injection, but add a diffusion barrier junction to the diode structure.
Figure 34A:
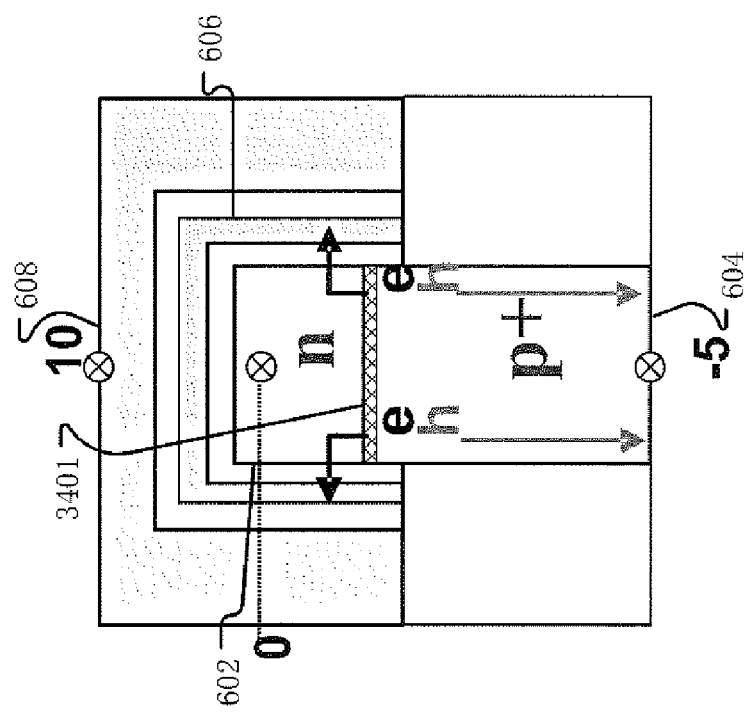

FIGS. 34A and 34B are similar to the simplified diagrams in FIGS. 7A and 7B of a gated diode nonvolatile memory cell operation performing band-to-band hot electron injection, but add a diffusion barrier junction to the diode structure.

FIGS. 8A and 8B are simplified diagrams of a gated diode nonvolatile memory cell operation performing hole tunnel injection. In FIG. 8A, the hole tunnel injection mechanism moves holes from the gate structure 608 biased at 10 V to the charge storage structure 606. The first diode node is biased at −10 V or is floating, and the second diode node 604 is biased at −10 V. In FIG. 5B, the hole tunnel injection mechanism moves holes from the first diode node 602 biased at 10 V or is floating, to the charge storage structure 606. The gate structure 608 is biased at −10 V, and the second diode node 604 is biased at 10 V.

Figure 35B:
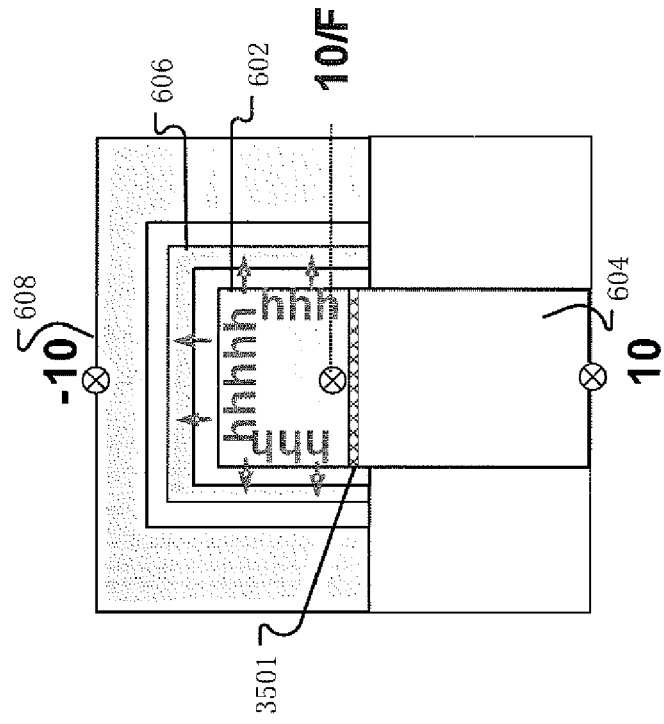
FIGS. 35A and 35B are similar to the simplified diagrams in FIGS. 8A and 8B of a gated diode nonvolatile memory cell operation performing hole tunnel injection, but add a diffusion barrier junction to the diode structure.
Figure 35A:
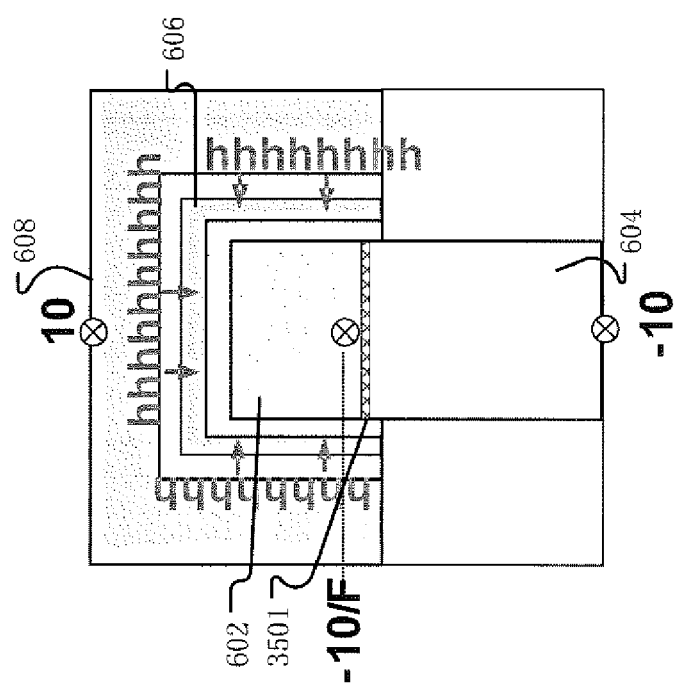

FIGS. 35A and 35B are similar to the simplified diagrams in FIGS. 5A and 8B of a gated diode nonvolatile memory cell operation performing hole tunnel injection, but add a diffusion barrier junction to the diode structure.

Figure 9B:
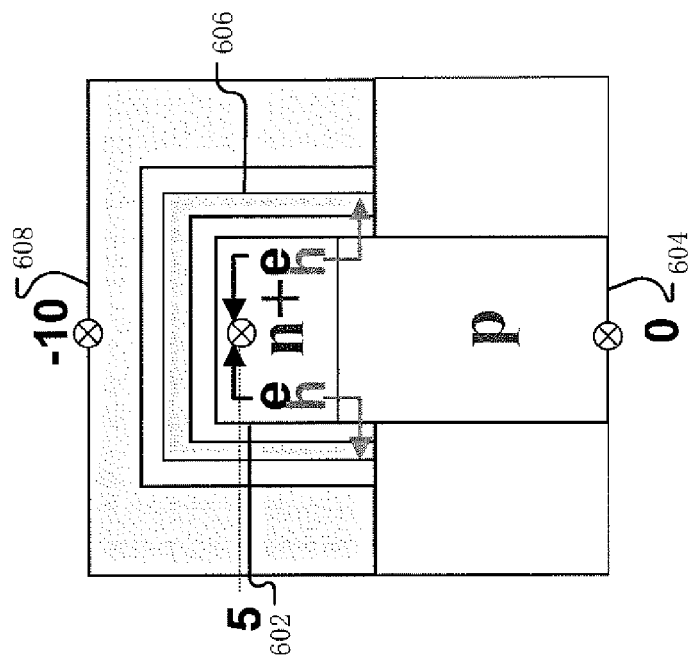
FIGS. 9A and 9B are simplified diagrams of a gated diode nonvolatile memory cell operation performing band-to-band hot hole injection.
Figure 9A:
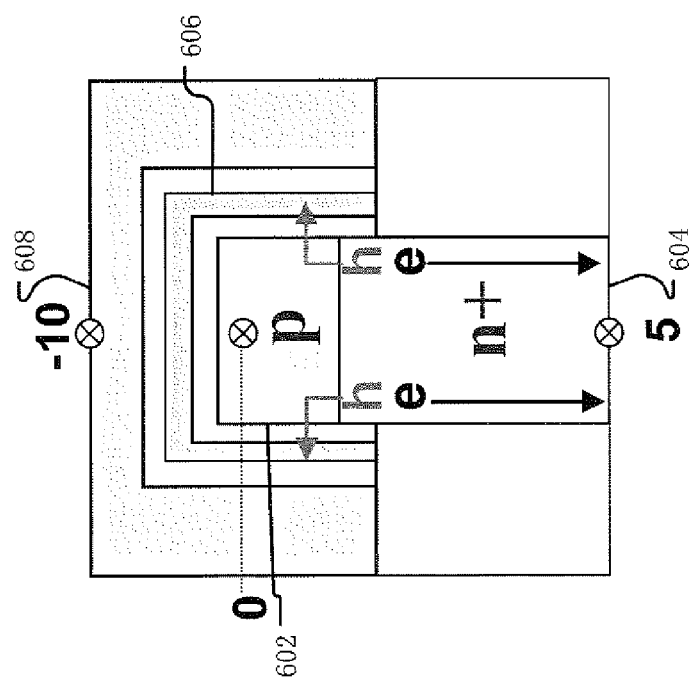

FIGS. 9A and 9B are simplified diagrams of a gated diode nonvolatile memory cell operation performing band-to-band hot hole injection. In FIG. 9A, the band-to-band hot hole injection moves holes from the diode structure to the charge storage structure 606. The p-type first diode node 602 is biased at 0 V, the gate structure 608 is biased at −10 V, and electrons of the resulting electron-hole pairs flow into the n+-type second node 604 is biased at 5 V. In FIG. 9B, the band-to-band hot hole injection moves holes from the diode structure to the charge storage structure 606. The p-type second diode node 604 is biased at 0 V, the gate structure 608 is biased at −10 V, and electrons of the resulting electron-hole pairs flow into the n+-type first node 602 biased at 5 V.

Band-to-band currents flowing through the diode structure determine the charge storage state of the charge storage structure with great precision, due to combined is vertical and lateral electrical fields. Larger vertical and lateral electrical fields give rise to larger band-to-band currents. A bias arrangement is applied to the various terminals, such that the energy bands bend sufficiently to cause hand-to-band current in the diode structure, while keeping the potential difference between the diode nodes sufficiently low enough such that programming or erasing does not occur.

In example bias arrangements, the diode structure is reverse biased. Additionally, the voltage of the gate structure causes the energy bands to bend sufficiently such that band-to-band tunneling occurs through the diode structure. A high doping concentration in the one of the diode structure nodes, with the resulting high charge density of the space charge region, and the accompanying short length of the space charge region over which the voltage changes, contributes to the sharp energy band bending. Electrons in the valence band on one side of the diode structure junction tunnel through the forbidden gap to the conduction band on the other side of the diode structure junction and drift down the potential hill, deeper into the n-type diode structure node. Similarly, holes drift up the potential hill, away from either n-type diode structure node, and toward the p-type diode structure node.

The voltage of the gate structure controls the voltage of the portion of the diode structure by the dielectric structure which is between the diode structure and the charge storage structure. As the voltage of the gate structure becomes more negative, the voltage of the portion of the diode structure by this dielectric structure becomes more negative, resulting in deeper band bending in the diode structure. More band-to-band current flows, as a result of at least some combination of 1) an increasing overlap between occupied electron energy levels on one side of the bending energy bands, and unoccupied electron energy levels on the other side of bending energy bands, and 2) a narrower barrier width between the occupied electron energy levels and the unoccupied electron energy levels (Sze, *Physics of Semiconductor Devices*, 1981).

The net negative or net positive charge stored on the charge storage structure further affects the degree of band bending. In accordance with Gauss's Law, when a negative voltage is applied to the gate structure relative to the diode structure, a stronger electric field is experienced by portions of the diode structure which are near portions of the charge storage structure having relatively higher net negative charge. Similarly, when a positive voltage is applied to the gate structure relative to the diode structure, a stronger electric field is experienced by portions of the diode structure which are near portions of the charge storage structure having relatively higher net positive charge.

The different bias arrangements for reading, and bias arrangements for programming and erasing, show a careful balance. For reading, the potential difference between the diode structure terminals should not cause a substantial number of charge carriers to transit a dielectric to the charge storage structure and affect the charge storage state. In contrast, for programming and erasing, the potential difference between the diode structure terminals can be sufficient to cause a substantial number of carriers to transit a dielectric and affect the charge storage state by band-to-band hot carrier injection.

Figure 36A:
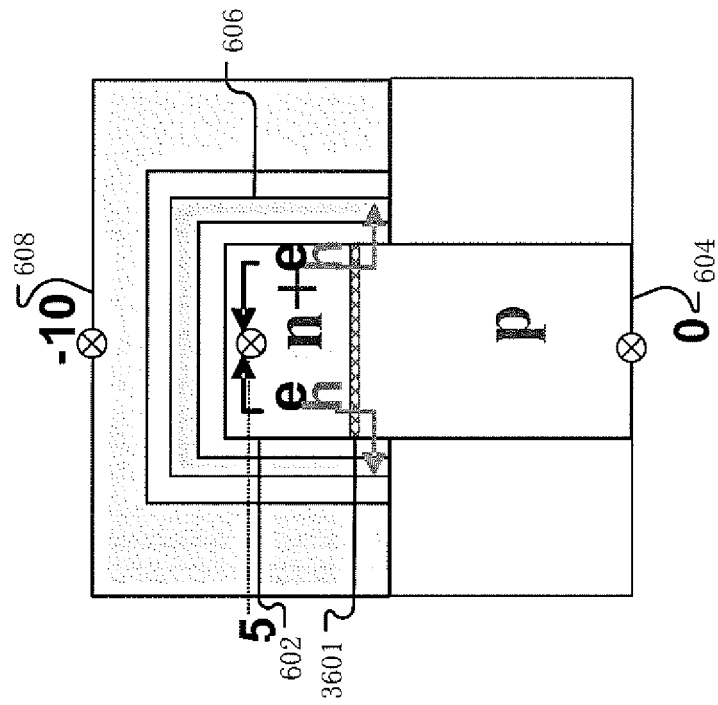
FIGS. 36A and 36B are similar to the simplified diagrams in FIGS. 9A and 9B of a gated diode nonvolatile memory cell operation performing band-to-band hot hole injection, but add a diffusion barrier junction to the diode structure.
Figure 36B:
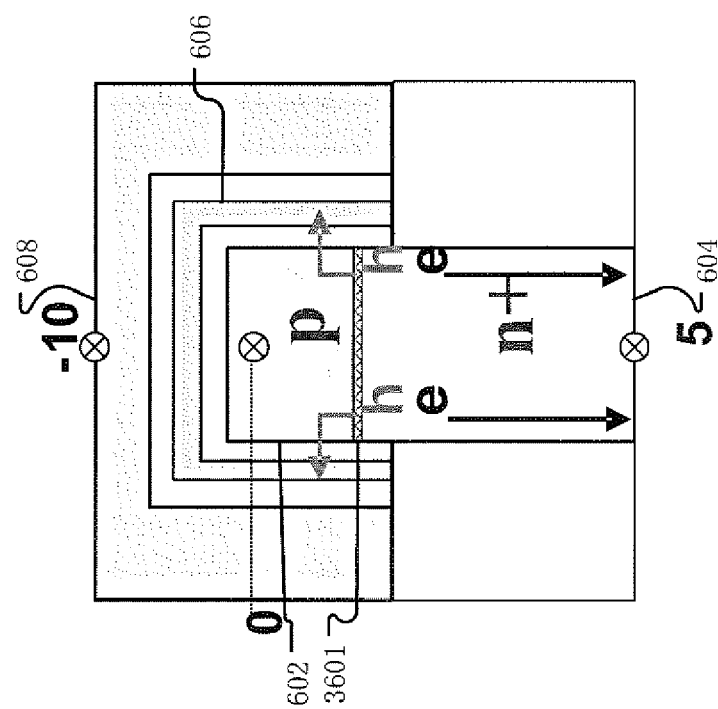

FIGS. 36A and 36B are similar to the simplified diagrams in FIGS. 9A and 9B of a gated diode nonvolatile memory cell operation performing band-to-band hot hole injection, but add a diffusion barrier junction to the diode structure.

Figure 10B:
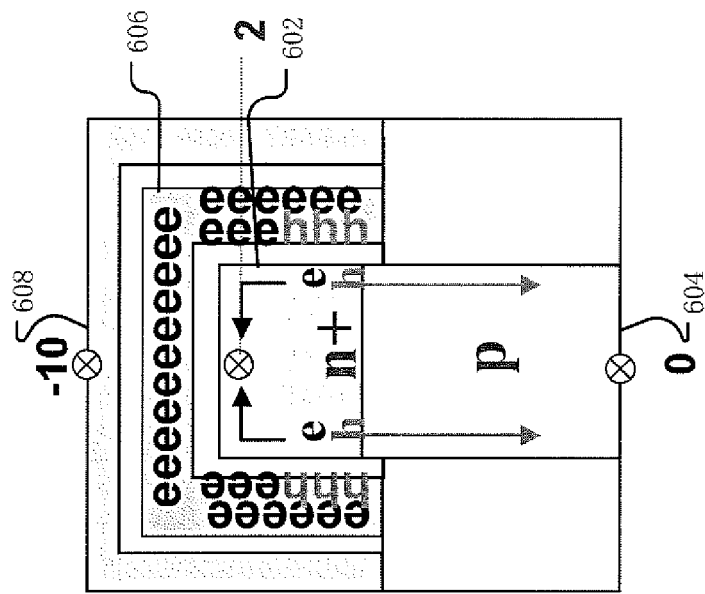
FIGS. 10A and 10B are simplified diagrams of a gated diode nonvolatile memory cell operation performing band-to-band sensing with different amounts of net positive or net negative charge characterizing the charge storage structure.
Figure 10A:
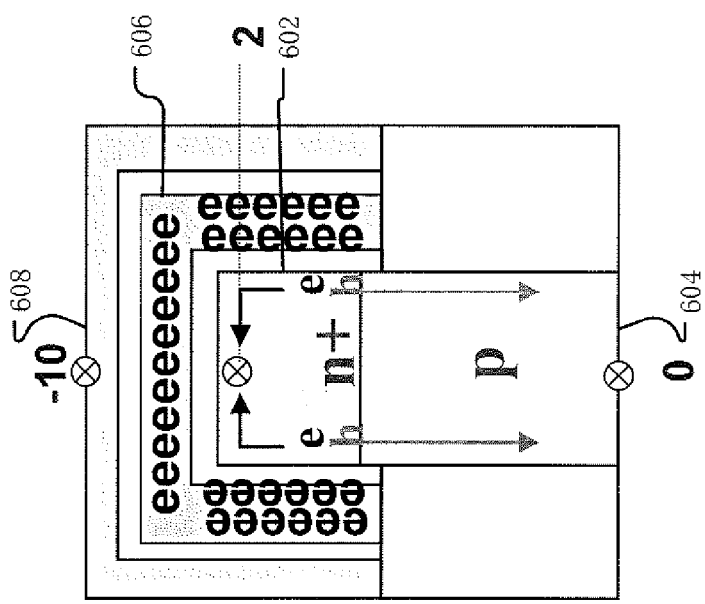

FIGS. 10A and 10B are simplified diagrams of a gated diode nonvolatile memory cell operation performing band-to-band sensing with different amounts of net positive or net negative charge characterizing the charge storage structure. In FIGS. 10A and 10B, band-to-band sensing mechanism creates electron-hole pairs in the diode structure. Resulting electrons flow into the n+-type first diode node 602 biased at 2 V, and resulting holes flow into the p-type second diode node 604 biased at 0 V. The gate structure 608 is biased at −10 V. In FIG. 10A, the charge storage structure 606 stores relatively more negative net charge by the diode structure junction between the n+-type first diode node 602 and the p-type second diode node 604. In FIG. 10B, the charge storage structure 606 stores relatively more positive net charge by the diode structure junction between the n+-type first diode node 602 and the p-type second diode node 604. Greater band bending in the diode structure occurs in FIG. 10A than in FIG. 10B, and greater band-to-band sensing current flows in FIG. 10A than in FIG. 10B.

Figure 37A:
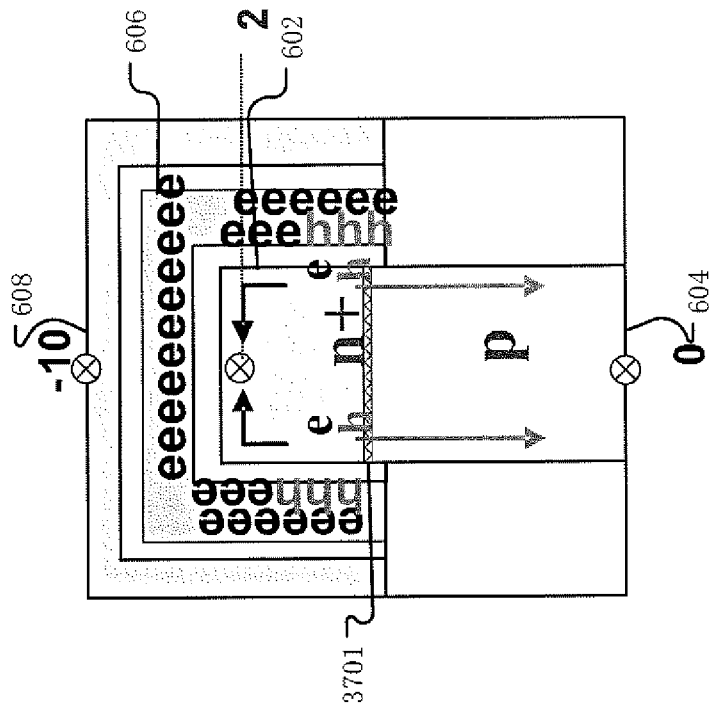
FIGS. 37A and 37B are similar to the simplified diagrams in FIGS. 10A and 11B of a gated diode nonvolatile memory cell operation performing band-to-band sensing with different amounts of net positive or net negative charge characterizing the charge storage structure, but add a diffusion barrier junction to the diode structure.
Figure 37B:
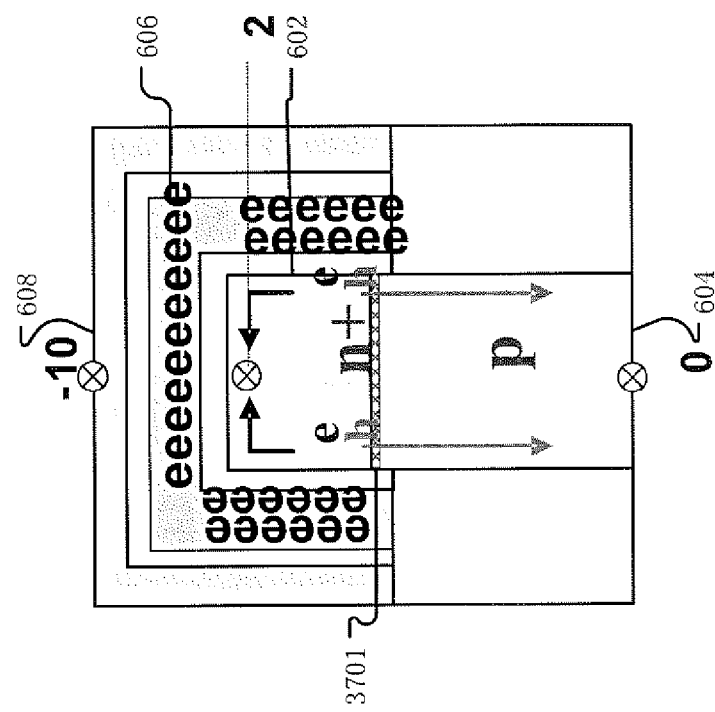

FIGS. 37A and 37B are similar to the simplified diagrams in FIGS. 10A and 10B of a gated diode nonvolatile memory cell operation performing band-to-band sensing with different amounts of net positive or net negative charge characterizing the charge storage structure, but add a diffusion barrier junction to the diode structure.

Figure 11B:
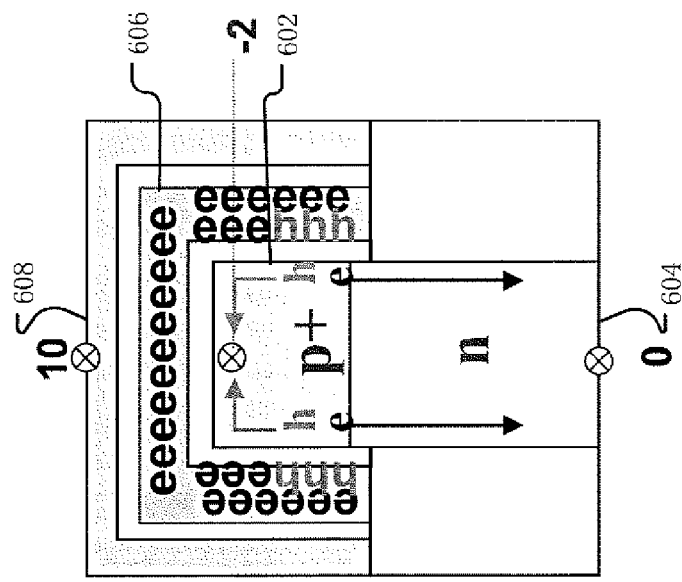
FIGS. 11A and 11B are simplified diagrams of a gated diode nonvolatile memory cell operation performing band-to-band sensing with different amounts of net positive or net negative charge characterizing the charge storage structure, but with a different diode node arrangement than in FIGS. 10A and 10B.
Figure 11A:
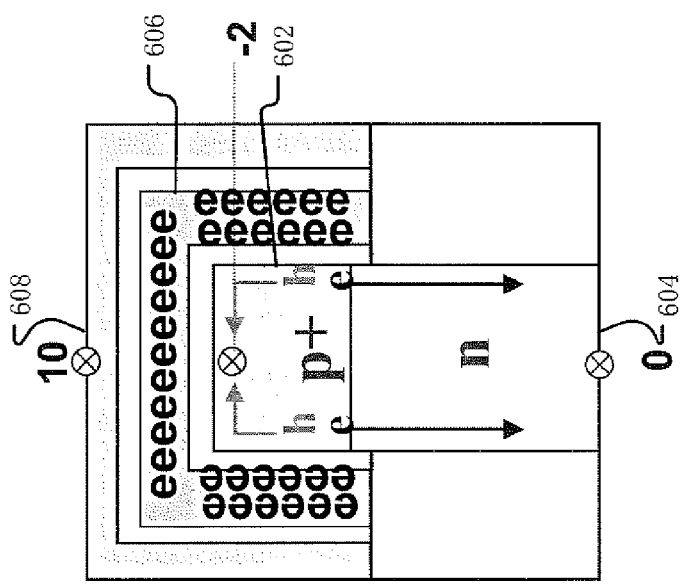

FIGS. 11A and 11B are simplified diagrams of a gated diode nonvolatile memory cell operation performing band-to-band sensing with different amounts of net positive or net negative charge characterizing the charge storage structure, but with a different diode node arrangement from FIGS. 10A and 10B. In particular, the first node 602 of the diode structure substantially surrounded by the combined charge storage and dielectric structure is p+-type, and the second node of the diode structure 604 is n-type. The band-to-band sensing mechanism creates electron-hole pairs in the diode structure. Resulting holes flow into the p+-type first diode node 602 biased at −2 V, and resulting electrons flow into the n-type second diode node 604 biased at 0 V. The gate structure 608 is biased at 10 V. In FIG. 11A, the charge storage structure 606 stores relatively more negative net charge by the diode structure junction between the p+-type first diode node 602 and the n-type second diode node 604. In FIG. 11B, the charge storage structure 606 stores a relatively more positive net charge by the diode structure junction between the p+-type first diode node 602 and the n-type second diode node 604. Greater band bending in the diode structure occurs in FIG. 11B than in FIG. 11A, and greater band-to-band sensing current flows in FIG. 11B than in FIG. 11A.

In other embodiments, the more heavily doped node is the second node of the diode structure, and the less heavily doped node is the first node of the diode structure substantially surrounded by the combined charge storage and dielectric structure.

Figure 38A:
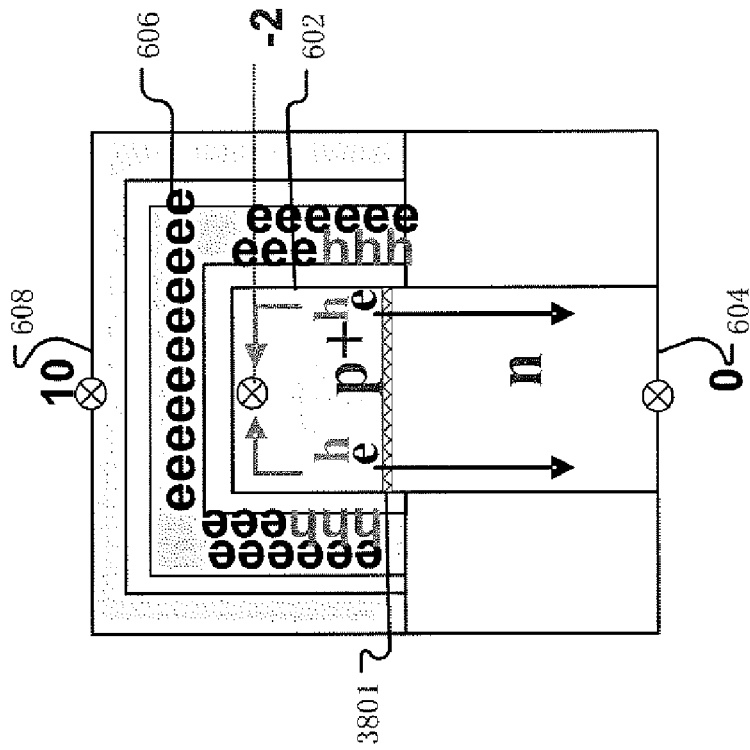
FIGS. 38A and 38B are similar to the simplified diagrams in FIGS. 11A and 11B of a gated diode nonvolatile memory cell operation performing band-to-band sensing with different amounts of net positive or net negative charge characterizing the charge storage structure, but add a diffusion barrier junction to the diode structure, and have a different diode node arrangement than in FIGS. 37A and 37B.
Figure 38B:
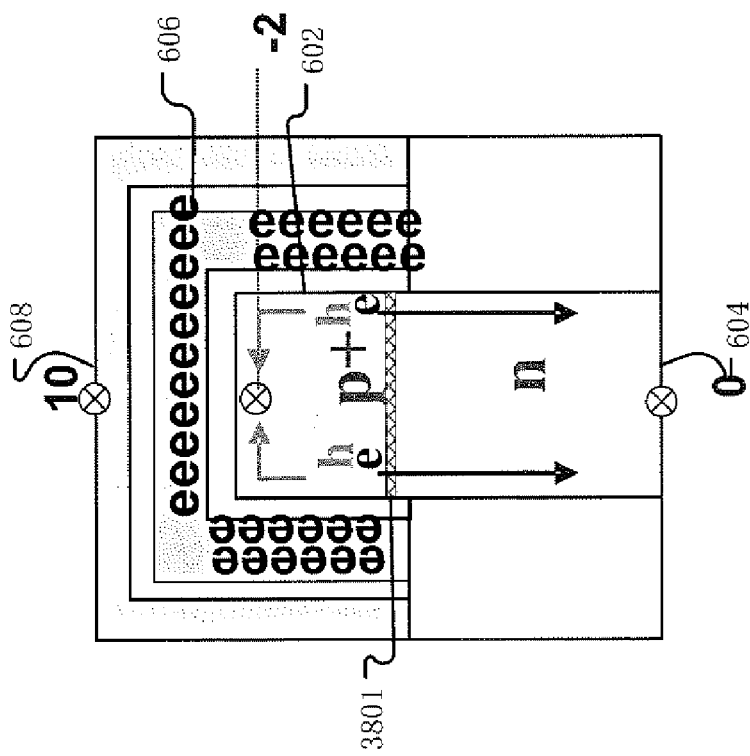

FIGS. 38A and 38B are similar to the simplified diagrams in FIGS. 11A and 11B of a gated diode nonvolatile memory cell operation performing band-to-band sensing with different amounts of net positive or net negative charge characterizing the charge storage structure, but add a diffusion barrier junction to the diode structure, and have a different diode node arrangement than in FIGS. 37A and 37B.

Figure 12B:
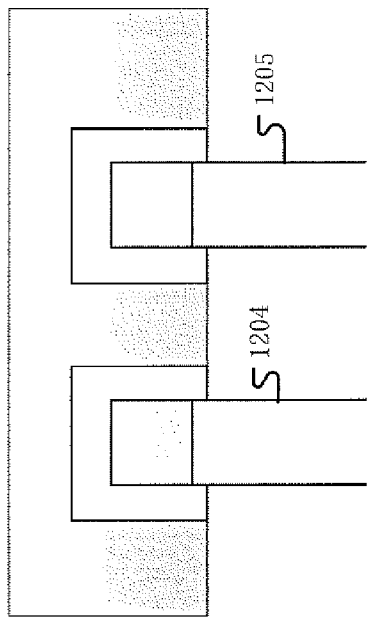
FIGS. 12A and 12B are simplified diagrams of neighboring gated diode nonvolatile memory cells, with and without interconnected second nodes.
Figure 12A:
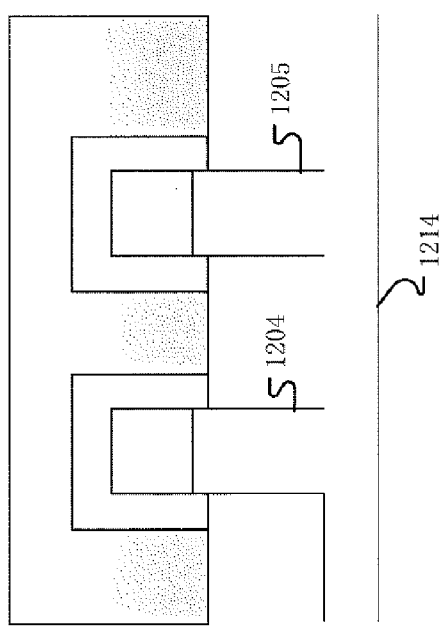

FIGS. 12A and 12B are simplified diagrams of neighboring gated diode nonvolatile memory cells, with and without interconnected second nodes. In FIG. 12A, neighboring gated diode nonvolatile memory cells respectively have second nodes 1204 and 1205. Both second nodes 1204 and 1205 of the neighboring gated diode nonvolatile memory cells extend beyond the oxide which isolates the upper portions of the second nodes 1204 and 1205 from each other, and connect into a common node structure 1214. This common node structure is treated as a same bit line used by both neighboring gated diode nonvolatile memory cells. In FIG. 12B, both second nodes 1204 and 1205 of the neighboring gated diode nonvolatile memory cells do not extend beyond the oxide which isolates the second nodes 1204 and 1205 from each other. Each of the second nodes 1204 and 1205 is treated as a distinct bit line, and the two second nodes 1204 and 1205 are not treated as a same bit line.

Figure 39A:
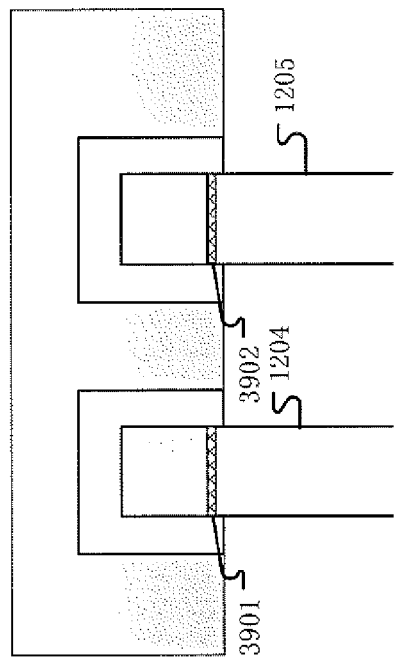
FIGS. 39A and 39B are similar to the simplified diagrams in FIGS. 12A and 12B of neighboring gated diode nonvolatile memory cells, with and without interconnected second nodes, but add a diffusion barrier junction to the diode structure.
Figure 39B:
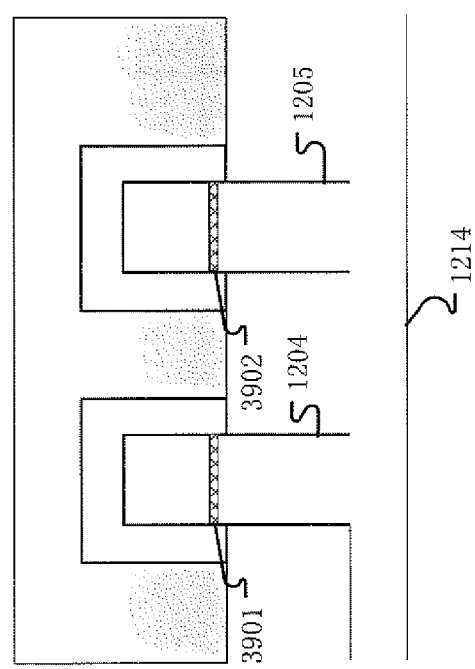

FIGS. 39A and 39B are similar to the simplified diagrams in FIGS. 12A and 12B of neighboring gated diode nonvolatile memory cells, with and without interconnected second nodes, but add a diffusion barrier junction to the diode structure.

Figure 13A:
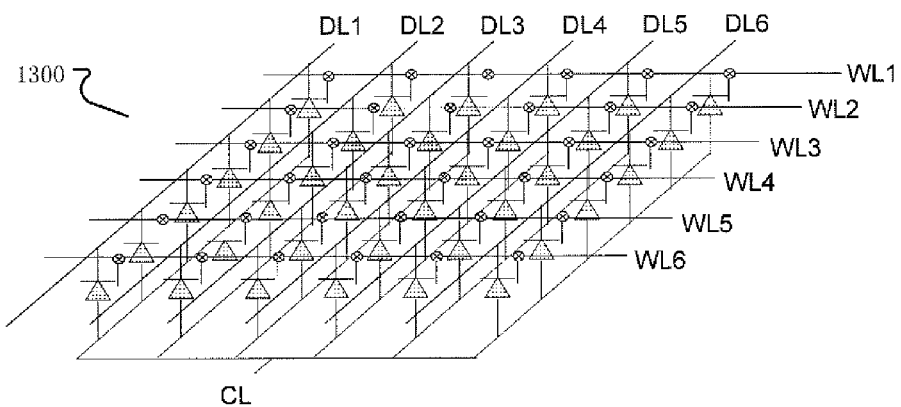
FIGS. 13A and 13B are simplified diagrams of an array of gated diode nonvolatile memory cells with interconnected second node columns, performing band-to-band sensing.
Figure 13B:
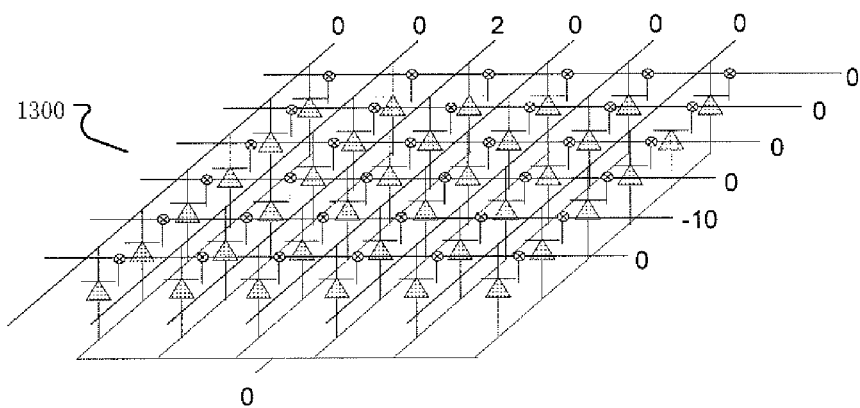

FIGS. 13A and 13B are simplified diagrams of an array of gated diode nonvolatile memory cells with interconnected second node columns, performing band-to-band sensing. The first node columns of the diode structures substantially surrounded by the combined charge storage and dielectric structures are n-type, and the second node columns of the diode structures are p-type. Neighboring second node columns of the diode structures extend beyond the oxide which isolates the upper portions of the second node columns from each other, and connect into a common bit line structure. In FIG. 13A, the first node columns of the diode structures are shown with bit line labels DL1 to DL6, the second node columns of the diode structures are shown with the bit line label CL, and the word lines are shown with word line labels WL1 to WL6. In FIG. 13B, voltages are applied to the diode columns and the word lines. The first node column DL3 is biased at 2 V, and the remaining first node columns are biased at 0 V. The second node columns are biased at 0 V. The word line WL5 is biased at −10 V, and the remaining word lines are biased at 0 V. A band-to-band sensing operation is thereby performed on the gate diode memory cell at the intersection of word line WL5 and the first node column DL3. By measuring the current flowing through the first node column DL3 or the second node columns CL, the charge storage state of the charge storage structure of that gate diode memory cell is determined.

Figure 14A:
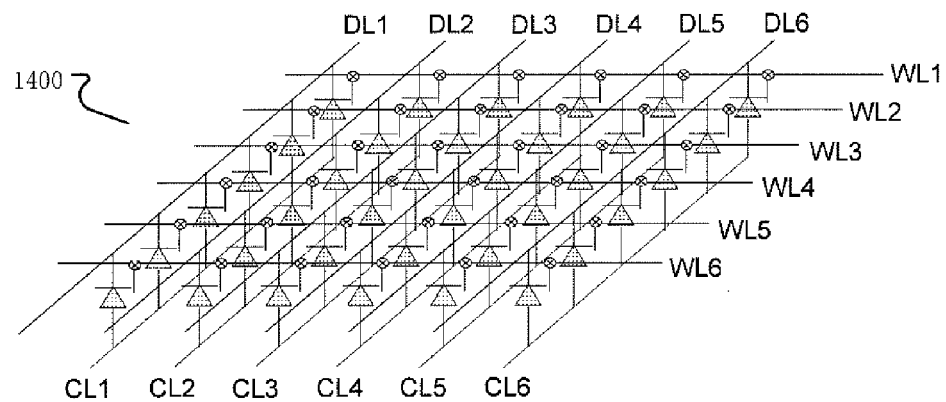
FIGS. 14A and 14B are simplified diagrams of an array of gated diode nonvolatile memory cells without interconnected second node columns, performing band-to-band sensing.
Figure 14B:
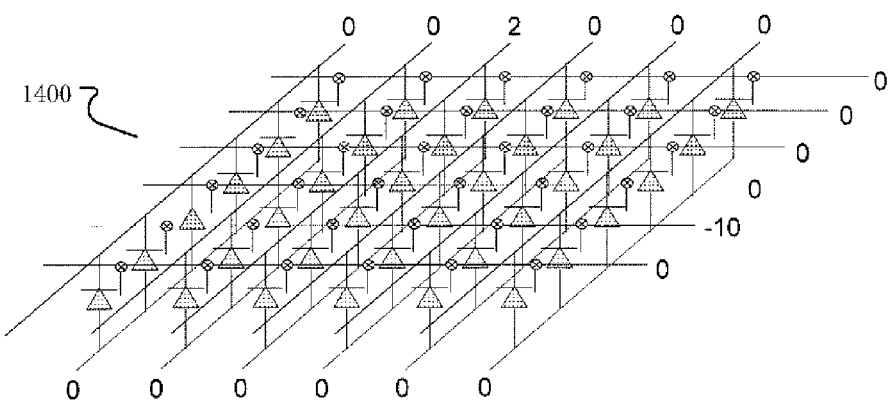

FIGS. 14A and 14B are simplified diagrams of an array of gated diode nonvolatile memory cells without interconnected second node columns, performing band-to-band sensing. Unlike the interconnected common bit line structure of the second node columns shown in FIGS. 13A and 13B, in FIGS. 14A and 14B neighboring second node columns of the diode structures are treated as distinct bit lines. In FIG. 14A, the second node columns of the diode structures are shown with bit line labels CL1 to CL6. In FIG. 14B, voltages are applied to the diode columns and the word lines. The first node column DL3 is biased at 2 V, and the remaining first node columns are biased at 0 V. The second node columns are biased at 0 V. The word line WL5 is biased at −10 V, and the remaining word lines are biased at 0 V. A band-to-band sensing operation is thereby performed on the gate diode memory cell at the intersection of word line WL5 and the first node column DL3/second node column CL3. By measuring the current flowing through the first node column DL3 or second node column CL3, the charge storage state of the charge storage structure of that gate diode memory cell is determined.

Figure 15A:
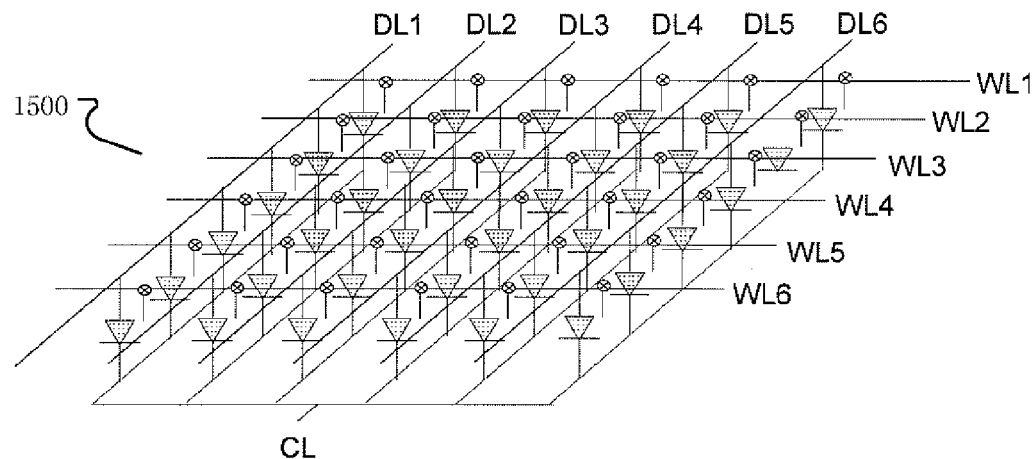
FIGS. 15A and 15B are simplified diagrams of an array of gated diode nonvolatile memory cells with interconnected second node columns, performing band-to-band sensing, where the doping arrangement of the diode structures is different from FIGS. 13A, 13B, 14A, and 14B.
Figure 15B:
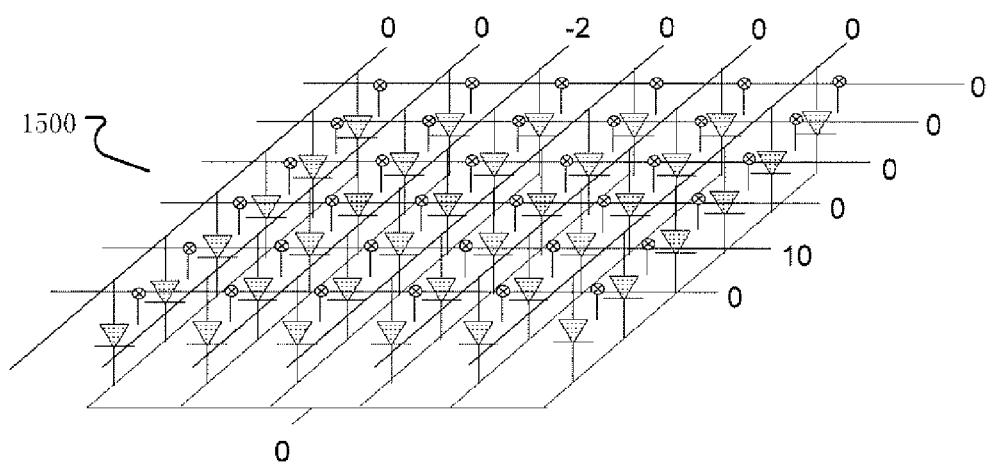

FIGS. 15A and 15B are simplified diagrams of an array of gated diode nonvolatile memory cells with interconnected second node columns, performing band-to-band sensing, where the doping arrangement of the diode structures is different from FIGS. 13A, 13B, 14A, and 14B. In FIGS. 15A and 15B, the first node columns of the diode structures substantially surrounded by the combined charge storage and dielectric structures are p-type, and the second node columns of the diode structures are n-type. Like FIGS. 13A and 13B, neighboring second node columns of the diode structures extend beyond the oxide which isolates the upper portions of the second node columns from each other, and connect into a common bit line structure. In FIG. 15A, the first node columns of the diode structures are shown with bit line labels DL1 to DL6, the second node columns of the diode structures are shown with the bit line label CL, and the word lines are shown with word line labels WL1 to WL6. In FIG. 15B, voltages are applied to the diode columns and the word lines. The first node column DL3 is biased at −2 V, and the remaining first node columns are biased at 0 V. The second node columns are biased at 0 V. The word line WL5 is biased at 10 V, and the remaining word lines are biased at 0 V. A band-to-band sensing operation is thereby performed on the gate diode memory cell at the intersection of word line WL5 and the first node column DL3. By measuring the current flowing through the first node column DL3 or the second node columns CL, the charge storage state of the charge storage structure of that gate diode memory cell is determined.

Figure 16A:
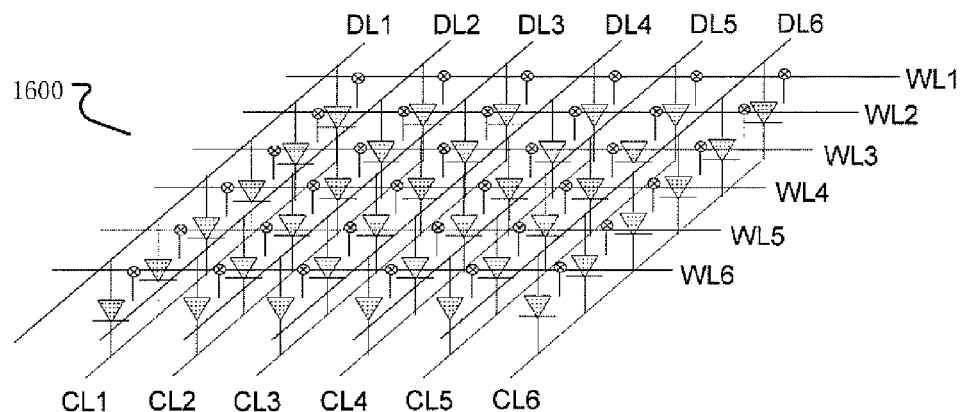
FIGS. 16A and 16B are simplified diagrams of an array of gated diode nonvolatile memory cells without interconnected second node columns, performing band-to-band sensing, where the doping arrangement of the diode structures is different from FIGS. 13A, 13B, 14A, and 14B.
Figure 16B:
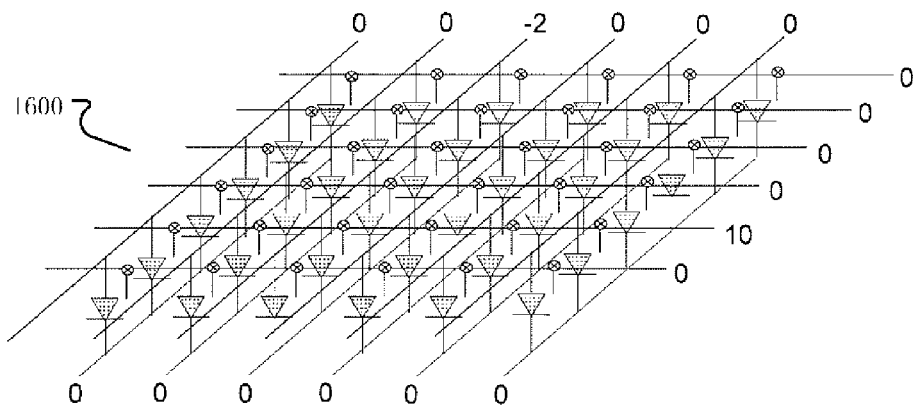

FIGS. 16A and 16B are simplified diagrams of an array of gated diode nonvolatile memory cells without interconnected node columns, performing band-to-band sensing, where the doping arrangement of the diode structures is like FIGS. 15S and 15B. Unlike the interconnected bit line structure of the second node columns shown in FIGS. 15A and 15B, in FIGS. 16A and 16B neighboring second node columns of the diode structures are treated as distinct bit lines. In FIG. 16A, the second node columns of the diode structures are shown with bit line labels CL1 to CL6. In FIG. 16B, voltages are applied to the diode columns and the word lines. The first node column DL3 is biased at −2 V, and the remaining first node columns are biased at 0 V. The second node columns are biased at 0 V. The word line WL5 is biased at 10 V, and the remaining word lines are biased at 0 V. A band-to-band sensing operation is thereby performed on the gate diode memory cell at the intersection of word line WL5 and the first node column DL3/second node column CL3. By measuring the current flowing through the first node column DL3 or second node column CL3, the charge storage state of the charge storage structure of that gate diode memory cell is determined.

The arrays of FIGS. 13A-16B have embodiments with and without diffusion barrier junctions.

FIGS. 17A, 17B, and 17C are simplified diagrams of neighboring gated diode nonvolatile memory cells without interconnected second nodes, in which electron tunnel injection is performed as in FIG. 6A, but on selected cells. In FIG. 17A, the electron tunnel injection mechanism moves electrons from the gate structure 608 biased at −10 V to the charge storage structures 606 and 607. The first diode nodes 602 and 603 are biased at 10 V or are floating, and the second diode nodes 604 and 605 are biased at 10 V. In FIG. 17B, the first diode node 602 is biased at 10 V or is floating, but the first diode node 603 is biased at −10 V. In FIG. 17C, the first diode nodes 602 and 603 are biased at 10 V or floating and 0V respectively, and the second diode nodes 604 and 605 are biased at 10 V and 0V respectively. The electron tunnel injection mechanism selectively moves electrons from the gate structure 608 biased at −10 V to the charge storage structure 606 but not to the charge storage structure 607. In other embodiments, the electron tunnel injection mechanism moves electrons from the first diode node to the charge storage structure as in FIG. 6B, but on selected cells. In other embodiments, the hole tunnel injection mechanism moves holes from the gate structure to the charge storage structure as in FIG. 8A, but on selected cells. In other embodiments, the hole tunnel injection mechanism moves holes from the first diode node to the charge storage structure as in FIG. 8B, but on selected cells.

FIGS. 40A and 40B are similar to the simplified diagrams in FIGS. 17A and 17B of neighboring gated diode nonvolatile memory cells without interconnected second nodes, in which electron tunnel injection is performed on selected cells, but add a diffusion barrier junction to the diode structure.

Figure 18C:
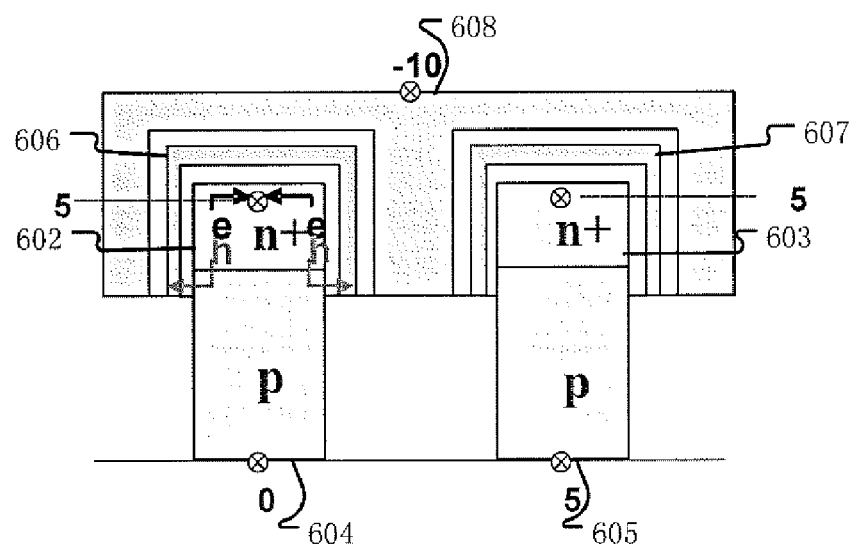

FIGS. 18A, 18B, and 18C are simplified diagrams of neighboring gated diode nonvolatile memory cells without interconnected second nodes, in which band-to-band hot hole injection is performed as in FIG. 9B, but on selected cells. In FIG. 18A, the band-to-band hot hole injection mechanism moves holes from the diode structure to the charge storage structure 606. The p-type second diode nodes 604 and 605 are biased at 0 V, the gate structure 608 is biased at −10 V, and electrons of the resulting electron-hole pairs flow into the n+-type first nodes 602 and 603 biased at 5 V. In FIG. 18B, the first diode node 602 is biased at 5 V, but the first diode node 603 is biased at 0 V. The band-to-band hot hole injection mechanism selectively moves holes from the diode structure to the charge storage structure 606 but not to the charge storage structure 607. FIG. 18C also shows band-to-band hot hole injection being performed selectively on the diode structure formed by the first diode node 602 and the second diode node 604, but not on the diode structure formed by the first diode node 603 and the second diode node 605, as in FIG. 15B. However, in FIG. 18C, the first diode node 603 is biased at 5 V and the second diode node 605 is biased at 5 V. Because a sufficient reverse bias is still absent in the diode structure formed by the first diode node 603 and the second diode node 605, the band-to-band hot hole injection mechanism is still absent in this diode structure. In other embodiments, the band-to-band hot hole injection mechanism selectively moves holes from the diode structure with a p-type first diode node and a n+-type second diode node to the charge storage structure as in FIG. 9A, but on selected cells. In other embodiments, the band-to-band hot electron injection mechanism selectively moves electrons from the diode structure with a p+-type first diode node and an n-type second diode node to the charge storage structure as in FIG. 7B, but on selected cells. In other embodiments, the band-to-band hot electron injection mechanism selectively moves electrons from the diode structure with an n-type first diode node and a p+-type second diode node to the charge storage structure as in FIG. 7A, but on selected cells.

Figure 41A:
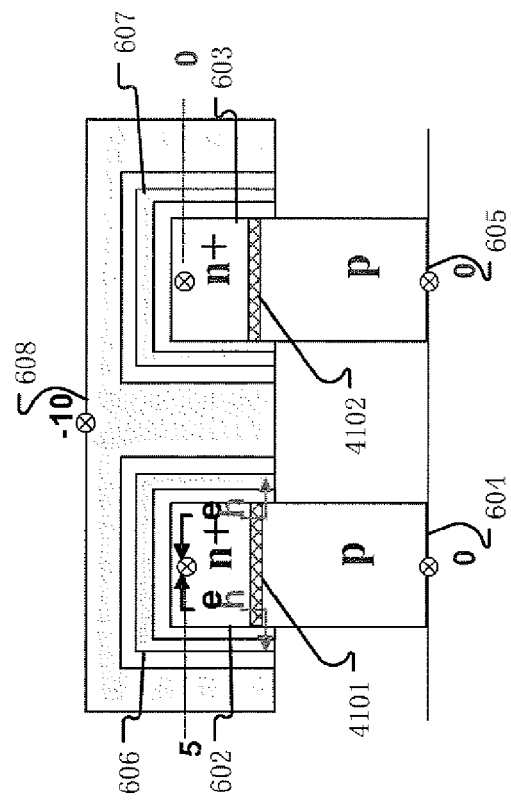
FIGS. 41A and 41B are similar to the simplified diagrams in FIGS. 18A, 1813, and 18C of neighboring gated diode nonvolatile memory cells without interconnected second nodes, in which band-to-band hot hole injection is performed on selected cells, but add a diffusion barrier junction to the diode structure.
Figure 41B:
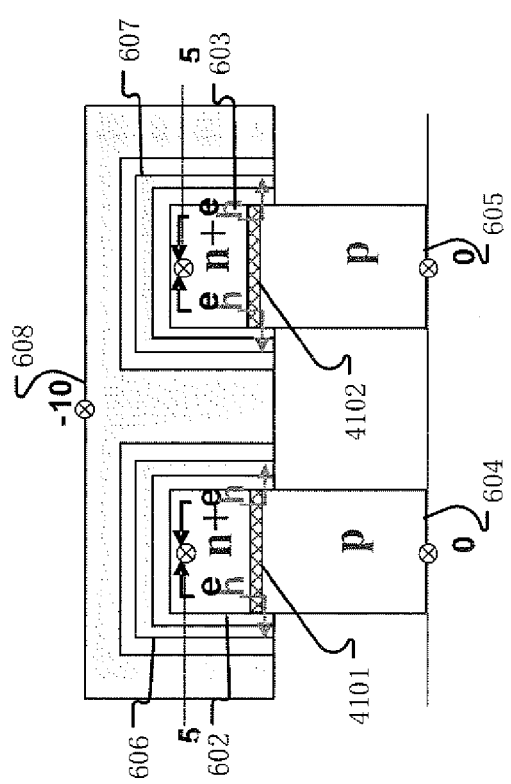
Figure 41C:
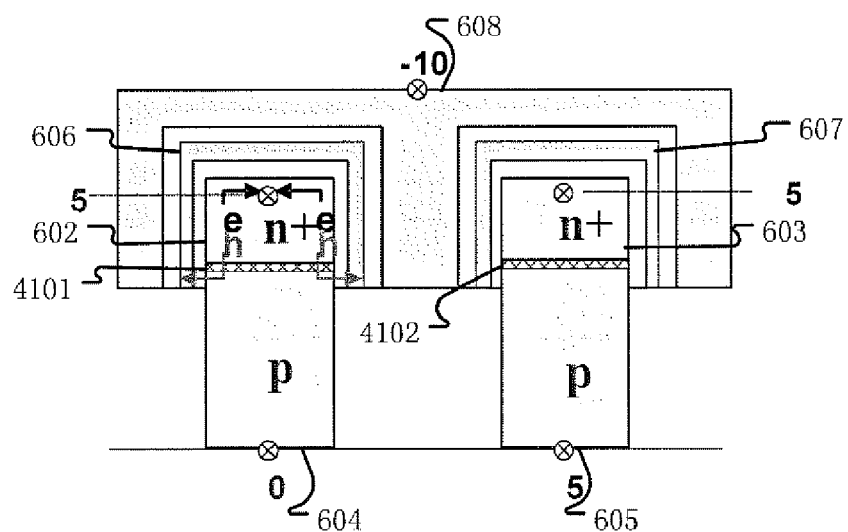

FIGS. 41A and 41B are similar to the simplified diagrams in FIGS. 18A, 18B, and 18C of neighboring gated diode nonvolatile memory cells without interconnected second nodes, in which band-to-band hot hole injection is performed on selected cells, but add a diffusion barrier junction to the diode structure.

Figures 22A, 22B:
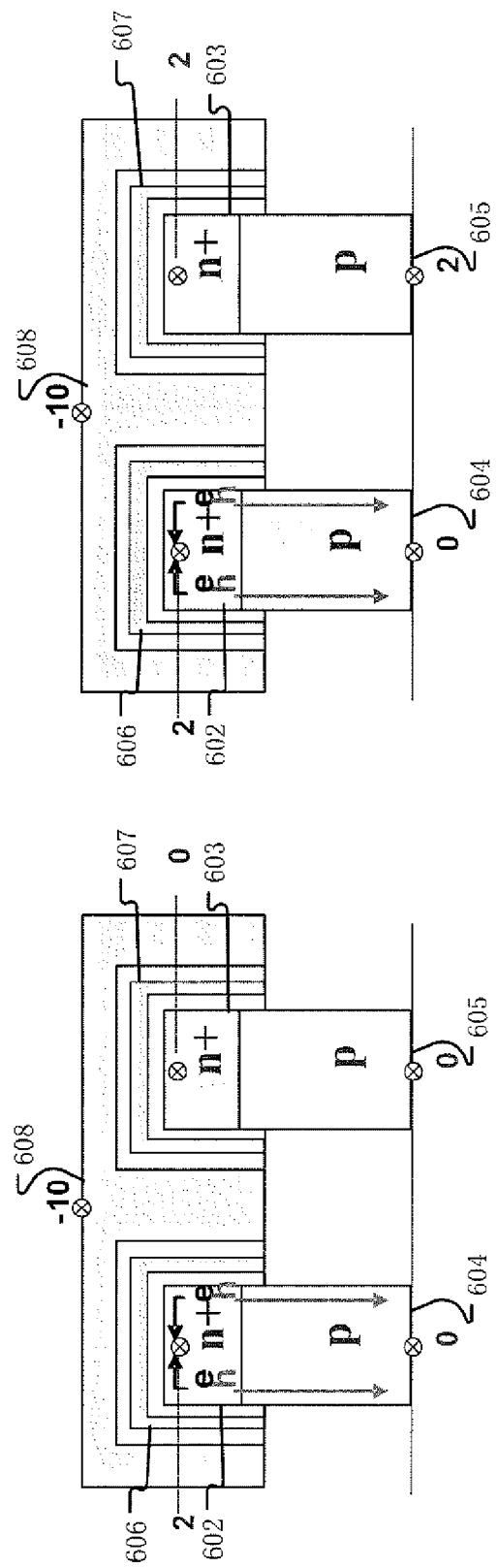
FIGS. 22A and 22B are simplified diagrams of neighboring gated diode nonvolatile memory cells without interconnected second nodes, in which band-to-band sensing is performed on selected cells.

FIGS. 22A and 22B are simplified diagrams of neighboring gated diode nonvolatile memory cells without interconnected second nodes, in which band-to-band sensing is performed as in FIGS. 10A and 10B, but on selected cells. In FIG. 22A, the band-to-band hot hole sensing mechanism creates electron-hole pairs in the diode structure formed by the n+-type first diode node 602 biased at 2 V and the p-type second diode node 604 biased at 0 V. Resulting electrons flow into the n+-type first diode node 602, and resulting holes flow into the p-type second diode node 604. This band-to-band sensing current indicates the amount of net positive or net negative charge characterizing the charge storage structure 606. The gate structure 608 is biased at −10 V. In the diode structure formed by the n+-type first diode node 603 biased at 0 V and the p-type second diode node 605 biased at 0 V, a band-to-band sensing current indicating the amount of charge characterizing the charge storage structure 607 does not flow, because a sufficient reverse bias is absent. FIG. 22B also shows band-to-band sensing being performed selectively on the diode structure formed by the first diode node 602 and the second diode node 604, but not on the diode structure formed by the first diode node 603 and the second diode node 605, as in FIG. 22A. However, in FIG. 22B, the first diode node 603 is biased at 2 V and the second diode node 605 is biased at 2 V. Because a sufficient reverse bias is still absent in the diode structure formed by the first diode node 603 and the second diode node 605, the band-to-band sensing mechanism is still absent. In other embodiments, the band-to-band sensing mechanism selectively flows in a diode structure with a p-type first diode node and a n+-type second diode node as in FIGS. 11A and 11B, but on selected cells.

Figures 42A, 42B:
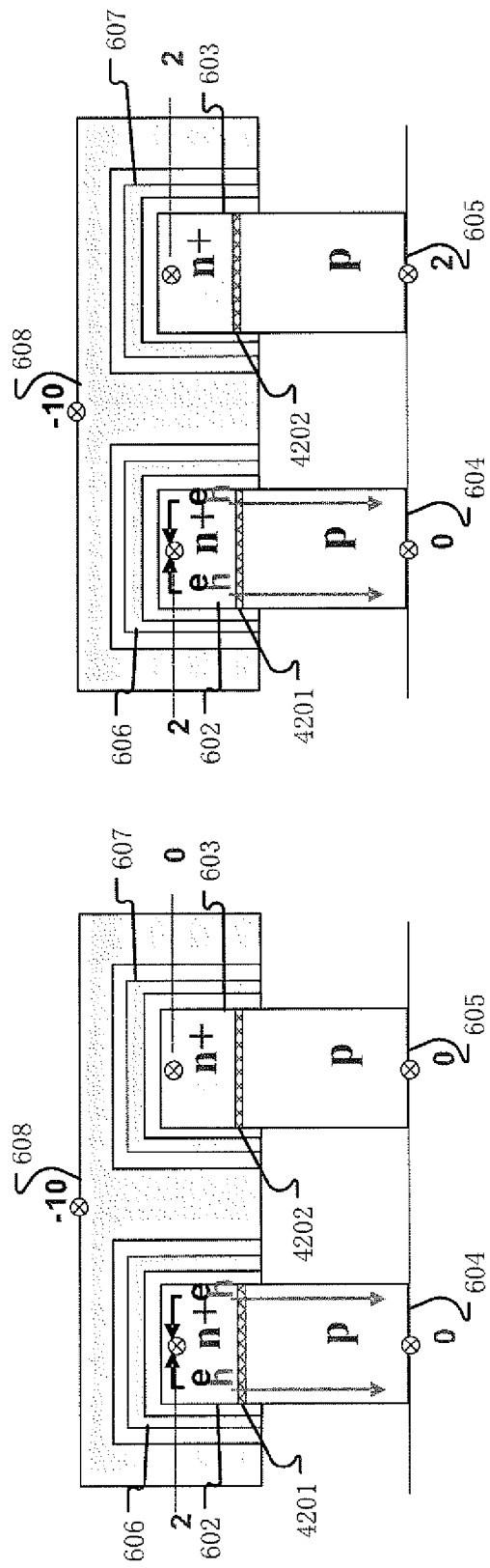
FIGS. 42A and 42B are similar to the simplified diagrams in FIGS. 22A and 22B of neighboring gated diode nonvolatile memory cells without interconnected second nodes, in which band-to-band sensing is performed on selected cells, but add a diffusion barrier junction to the diode structure.

FIGS. 42A and 42B are similar to the simplified diagrams in FIGS. 22A and 22B of neighboring gated diode nonvolatile memory cells without interconnected second nodes, in which band-to-band sensing is performed on selected cells, but add a diffusion barrier junction to the diode structure.

Figure 19A:
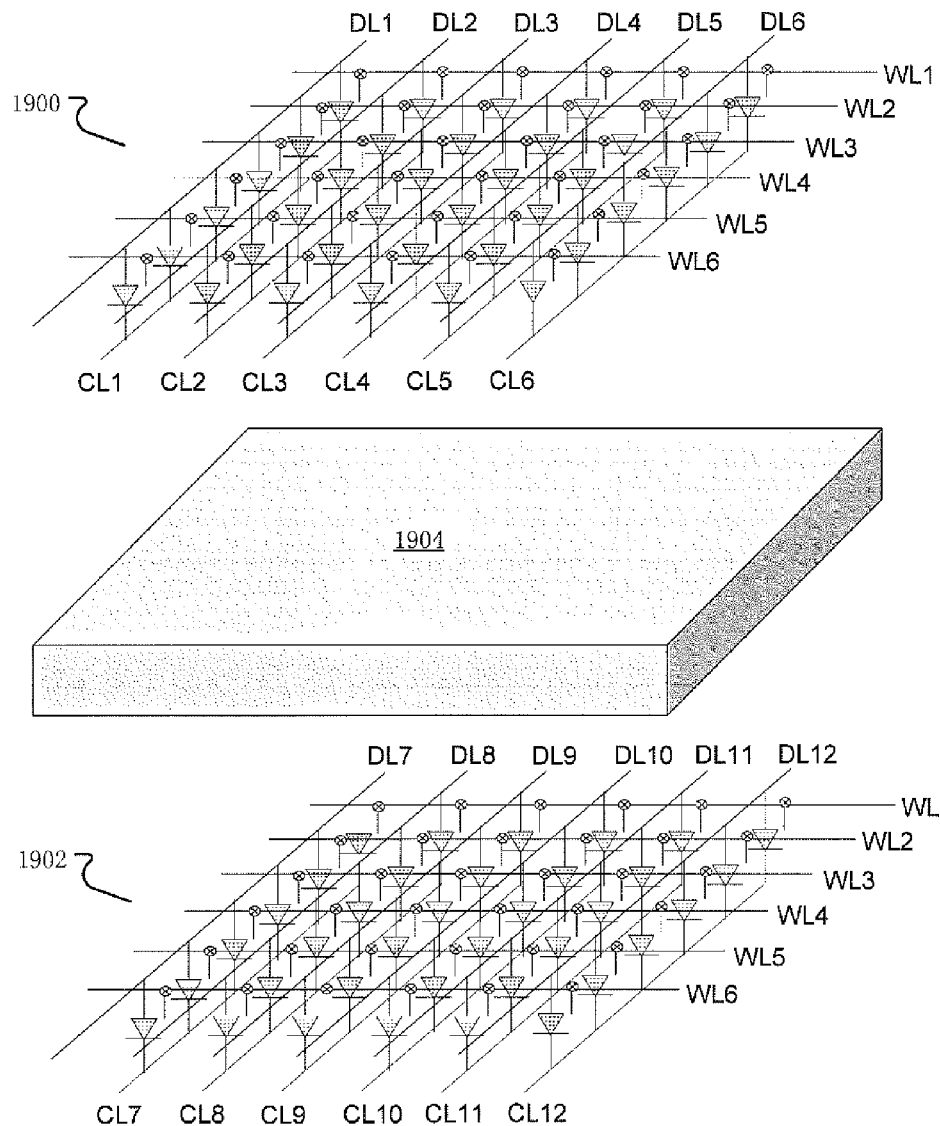
FIGS. 19A, 19B, and 19C are exploded view diagrams of multiple arrays of gated diode nonvolatile memory cells, with different interconnections of the word lines, first node columns, and second node columns, between different arrays.
Figure 19B:
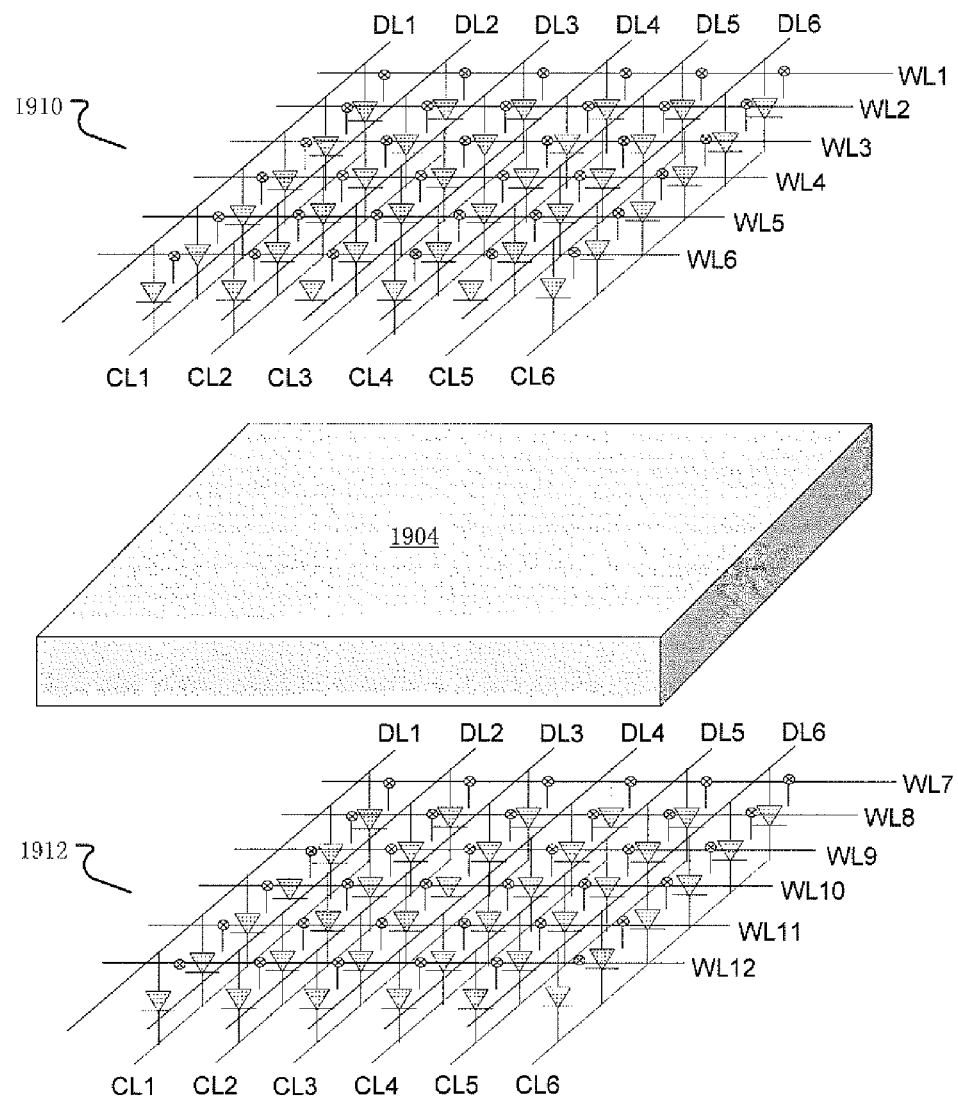
Figure 19C:
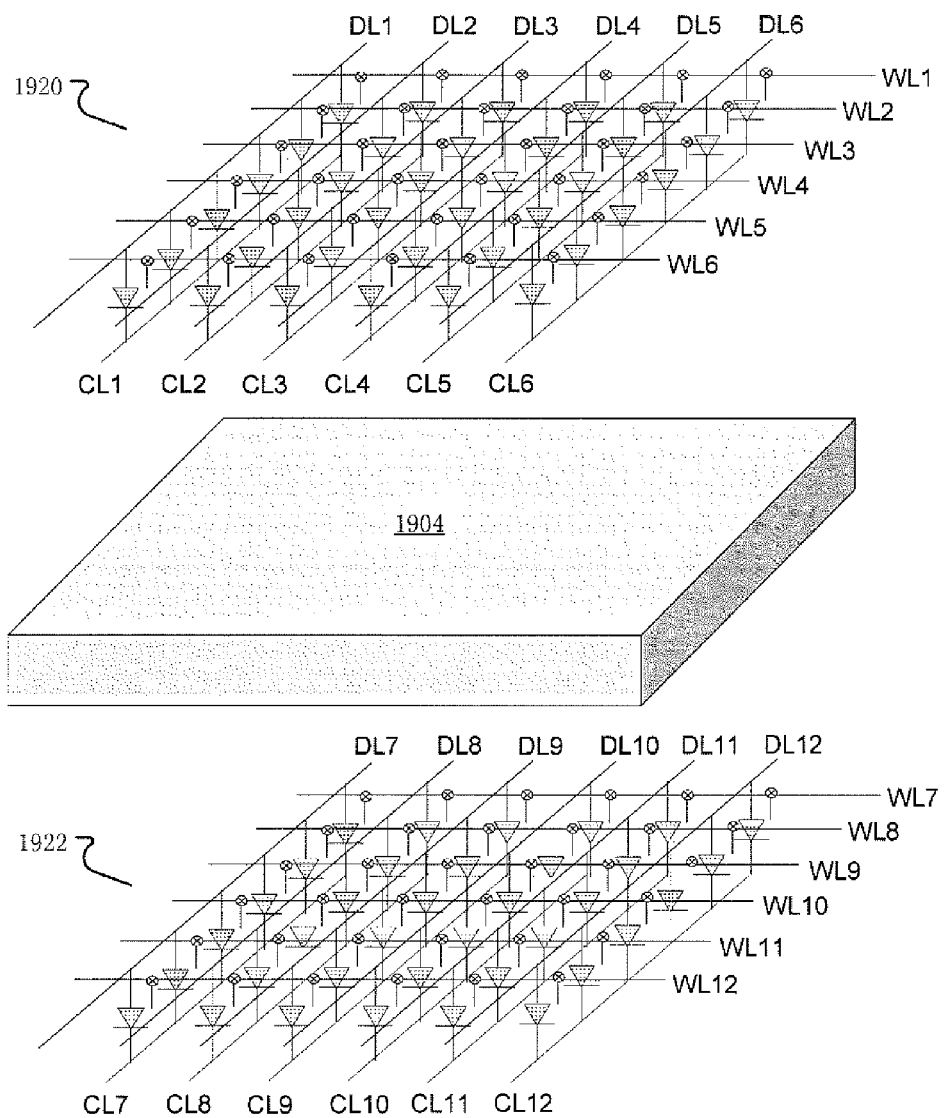

FIGS. 19A, 19B, and 19C are exploded view diagrams of multiple arrays of gated diode nonvolatile memory cells, with different interconnections of the word lines, first node columns, and second node columns, between different arrays. Each of the vertically displaced arrays is like the array shown in FIGS. 16A and 16B. Although the multiple arrays displaced vertically from one another by isolation oxide 1904 are part of the same integrated circuit, the multiple arrays are shown in exploded view to show the labels for all word lines and bit lines of the multiple arrays.

In FIG. 19A, the word lines of different arrays 1900 and 1902 are interconnected. The word lines of array 1900 and the word lines of array 1902 are both labeled WL1 to WL6. However, the first node columns and second node columns of different arrays are isolated from each other. The first node columns of array 1900 are labeled DL1 to DL6, and the first node columns of array 1902 are labeled DL7 to DL12. The second node columns of array 1900 are labeled CL1 to CL6, and the second node columns of array 1902 are labeled CL7 to CL12.

In FIG. 19B, the word lines of different arrays 1910 and 1912 are isolated from each other. The word lines of array 1910 are labeled WL1 to WL6, and the word lines of array 1912 are labeled WL7 to WL12. However, the first node columns and second node columns of the different arrays 1910 and 1912 are interconnected. The first node columns of array 1910 and array 1912 are both labeled DL1 to DL6, and the second node columns of array 1910 and array 1912 are both labeled CL1 to CL6.

In FIG. 19C, the word lines of different arrays 1920 and 1922, and the first node columns and second node columns of different arrays 1920 and 1922, are isolated from each other. The word lines of array 1920 are labeled WL1 to WL6, and the word lines of array 1922 are labeled WL7 to WL12. The first node columns of array 1920 are labeled DL1 to DL6, and the first node columns of array 1922 are labeled DL7 to DL12. The second node columns of array 1920 are labeled CL1 to CL6, and the second node columns of array 1922 are labeled CL7 to CL12.

In other embodiments, the multiple arrays have interconnected second node columns, such that a particular array of the multiple arrays has a common bit line structure for the second node columns of that array, or alternatively, for all of the arrays. In other embodiments, the first node columns are n-type and the second columns are p-type. The arrays of FIGS. 19A-C have embodiments with and without diffusion barrier junctions.

Figure 20:
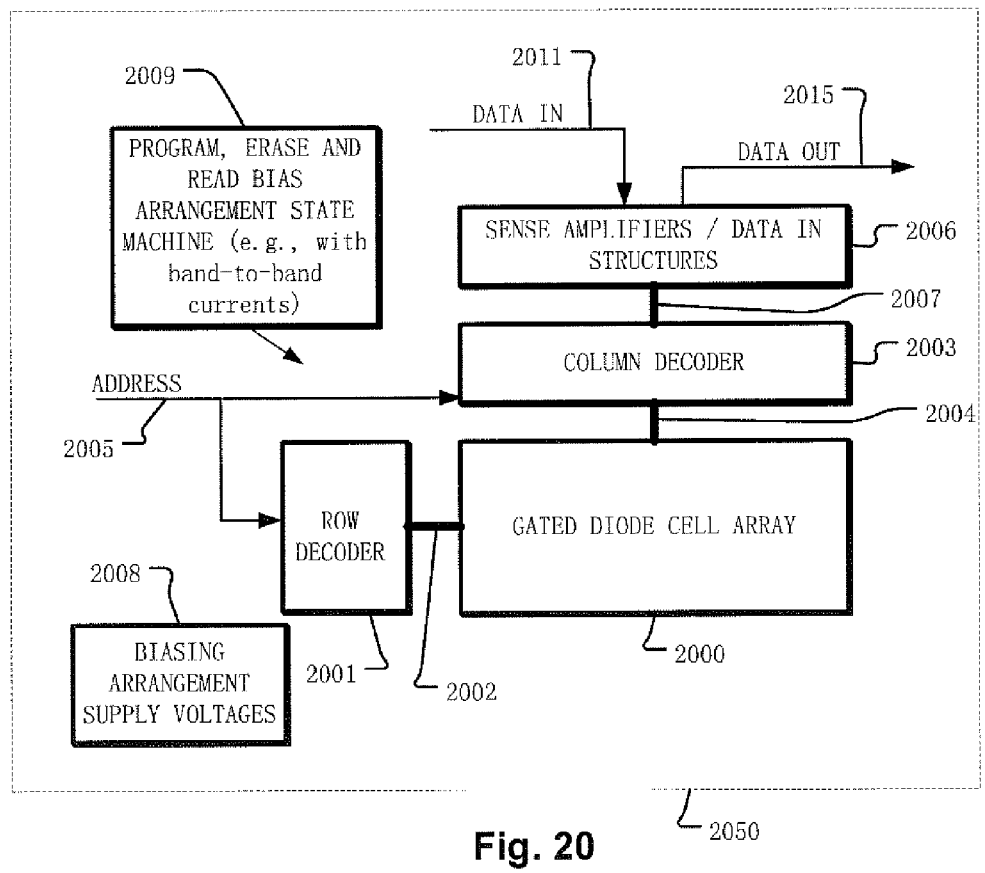
FIG. 20 is a simplified diagram of an integrated circuit with an array of gated diode nonvolatile memory cells and control circuitry.

FIG. 20 is a simplified diagram of an integrated circuit with an array of gated diode nonvolatile memory cells and control circuitry. The integrated circuit 2050 includes a memory array 2000 implemented using gate diode nonvolatile memory cells, on a semiconductor substrate. The gated diode memory cells of array 2000 may be individual cells, interconnected in arrays, or interconnected in multiple arrays. A row decoder 2001 is coupled to a plurality of word lines 2002 arranged along rows in the memory array 2000. A column decoder 2003 is coupled to a plurality of bit lines 2004 arranged along columns in the memory array 2000. Addresses are supplied on bus 2005 to column decoder 2003 and row decoder 2001. Sense amplifiers and data-in structures in block 2006 are coupled to the column decoder 2003 via data bus 2007. Data is supplied via the data-in line 2011 from input/output ports on the integrated circuit 2050, or from other data sources internal or external to the integrated circuit 2050, to the data-in structures in block 2006. Data is supplied via the data-out line 2015 from the sense amplifiers in block 2006 to input/output ports on the integrated circuit 2050, or to other data destinations internal or external to the integrated circuit 2050. A bias arrangement state machine 2009 controls the application of bias arrangement supply voltages 2008, such as for the erase verify and program verify voltages, and the arrangements for programming, erasing, and reading the memory cells, such as with the band-to-band currents. The integrated circuit of FIG. 20 has embodiments with and without diffusion barrier junctions.

FIGS. 21A-21H illustrate a sample process flow for multiple arrays of gated diode nonvolatile memory cells. FIG. 21A shows a structure with a p-type polysilicon layer 2112 on an oxide layer 2104 on a silicon substrate 2102. In FIG. 21B, sacrificial oxide 2116 is formed and nitride 2118 is formed. Shallow trench isolation is performed, resulting in multiple p-type polysilicon structures 2113. In FIG. 21C, the sacrificial oxide 2116 and nitride 2118 are removed. The multiple p-type polysilicon structures 2113 are implanted, resulting in p-type second nodes 2114 and n+-type first nodes 2121 of the gated diode nonvolatile memory cells. In FIG. 21D, the combined charge storage and dielectric structure 2123 and gate polysilicon 2132 are formed, completing the first array of gated diode nonvolatile memory cells. In FIG. 21E, another layer of oxide 2104 and another layer of p-type polysilicon 2112 are formed. In FIGS. 21F-21H, the steps of FIGS. 21B-D are substantially repeated to form another array of gated diode nonvolatile memory cells that is displaced vertically from the first array.

Figure 23A:
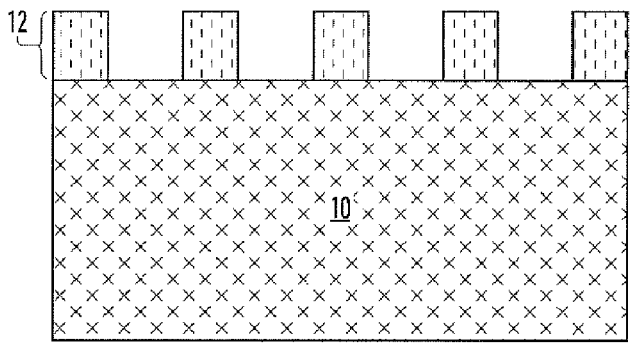
FIGS. 23A-23H illustrate a sample process flow for an array of gated diode nonvolatile memory cells.
Figure 23B:
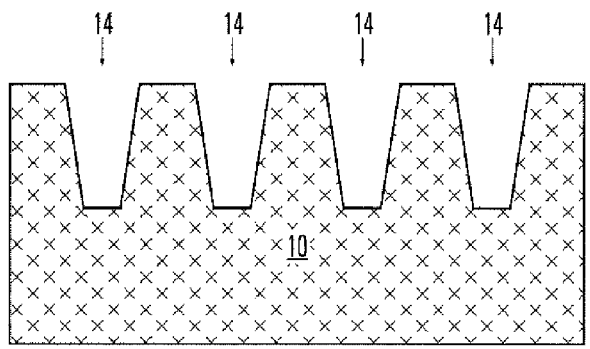
Figure 23C:
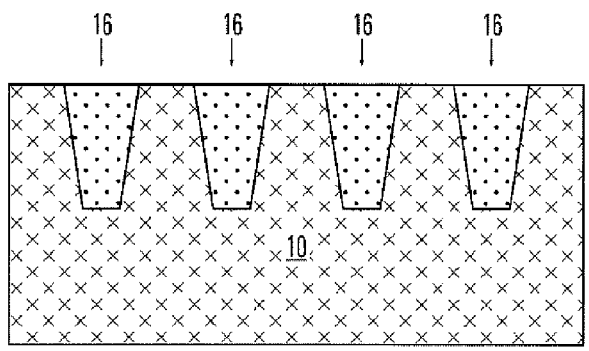
Figure 23D:
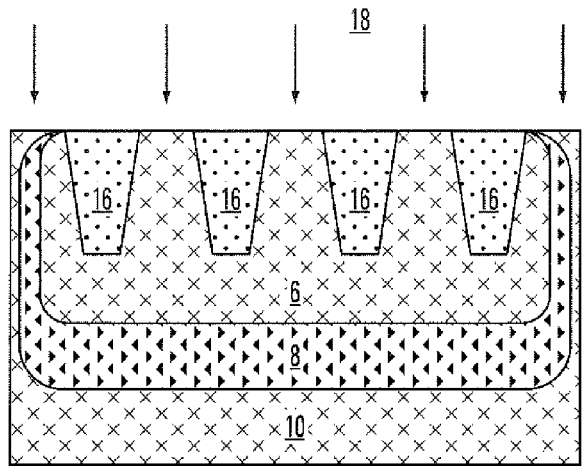
Figure 23E:
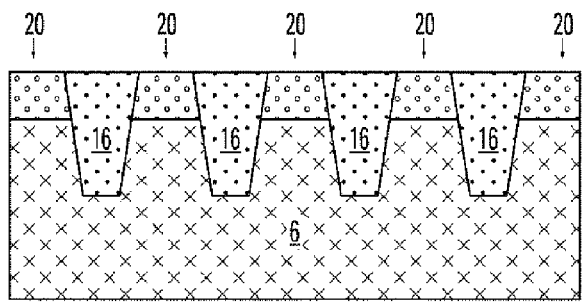
Figure 23F:
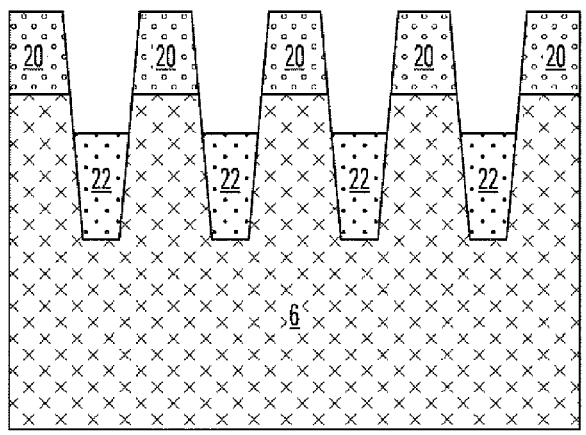
Figure 23G:
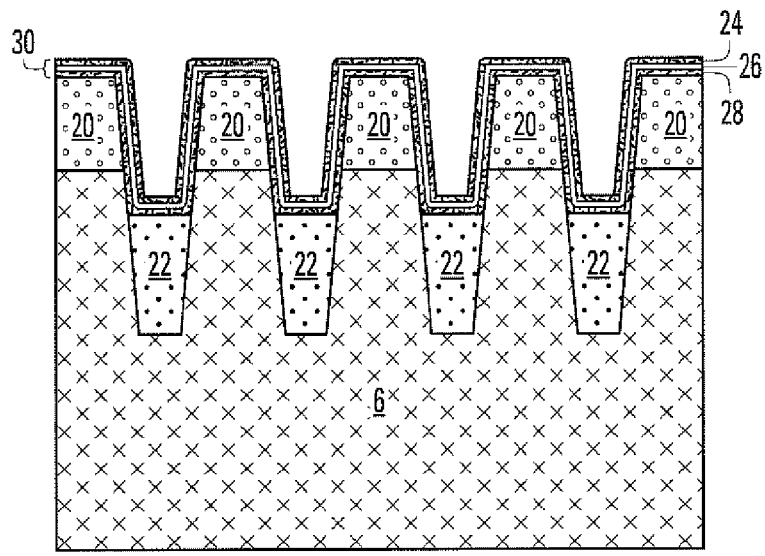
Figure 23H:
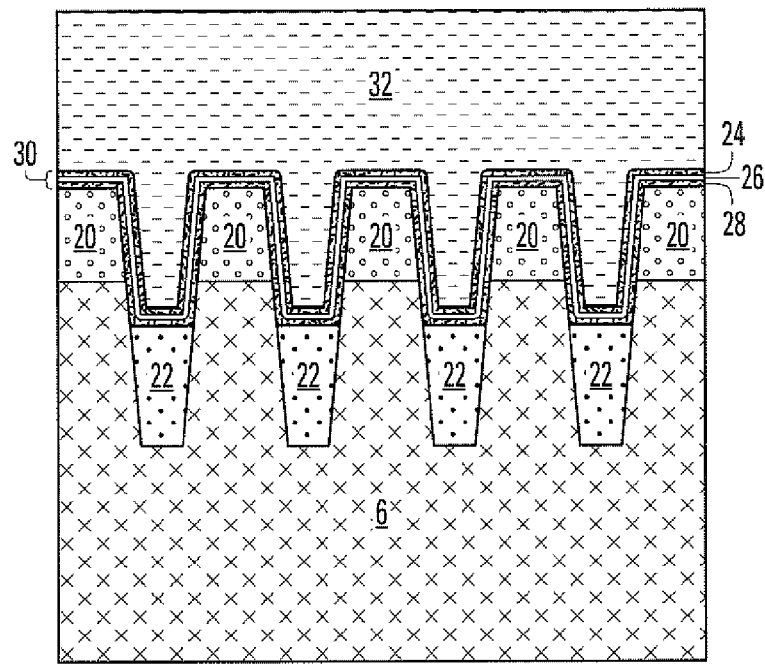

FIGS. 23A-H illustrate a sample process flow for multiple arrays of gated diode nonvolatile memory cells. FIG. 23A shows a substrate 10 with a photoresist pattern 12 that defines shallow trenches to isolate neighboring devices from each other. The substrate may be either p-type or n-type. FIG. 23B shows the shallow trenches 14 etched in the substrate 10 between the photoresist pattern 12. The photoresist pattern 12 has been removed. FIG. 23C shows isolation oxide 16 filling the shallow trenches 14 to isolate neighboring devices from each other. FIG. 23D shows ion implantation 18. Ion implantation 18 with different ions creates deep well 8 in substrate 10, and well 6 in deep well 8. For example, if the substrate 10 is p-type, then deep well 8 is n-type and well 6 is p-type. Alternatively, if the substrate 10 is n-type, then deep well 8 is p-type and well 6 is n-type. For simplicity in the subsequent drawings, the combination of wells and substrate is not shown as it is understood that the devices may be formed in either a well or a substrate. FIG. 23E shows the diffusion bit lines 20 also formed by the ion implantation 18 between the isolation oxide 16. The diffusion bit lines 20 are implanted with a dopant having a charge type opposite to that of the well 6 (which alternatively may be a substrate 10). FIG. 23F shows the partial removal of the isolation oxide 16. Partial removal by dip back or etch back from the isolation oxide 16, results in shallower isolation oxide 22. The surface of the shallower isolation oxide 22 is lower than the pn junction between the diffusion bit lines 20 and the well 6. FIG. 23G shows the formation of the ONO film 30, having an upper oxide 24, a nitride 26, and a lower oxide 28. The nitride structure in other embodiments is a floating gate or nanocrystal. Because the surface of the shallower isolation oxide 22 is lower than the pn junction between the diffusion bit lines 20 and the well 6, the ONO film 30 controls the voltage at the pn junction between the diffusion bit lines 20 and the well 6. FIG. 23H shows the formation of word lines 32 that provide a gate voltage to the devices. An n+ or p+ polysilicon film is deposited and etched to form multiple word lines. The gate material can also be a metal gate, such as silicide, Ry, Mo, and W.

Figure 24:
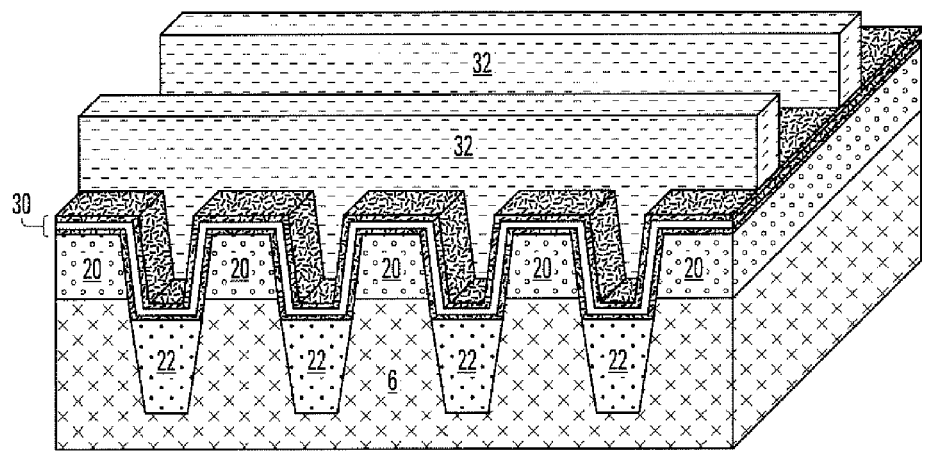
FIG. 24 is a perspective view of an array of gated diode nonvolatile memory cells as formed by the process of FIGS. 23A-23H.

FIG. 24 is a perspective view of an array of gated diode nonvolatile memory cells as formed by the process of FIGS. 23A-23H.

FIGS. 30A to 30F illustrate another sample process flow for an array of gated diode nonvolatile memory cells.

Figure 30A:
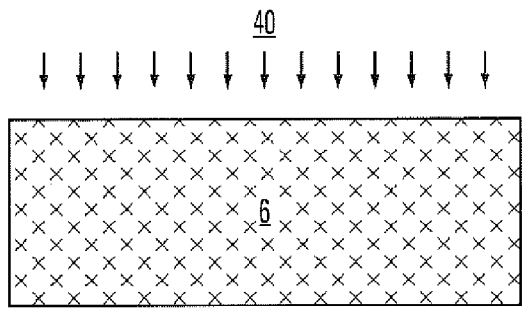
FIGS. 30A to 30F illustrate another sample process flow for an array of gated diode nonvolatile memory cells.
Figure 30B:
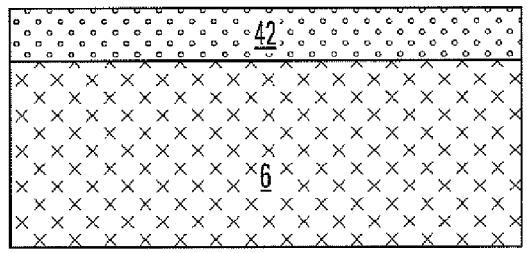
Figure 30C:
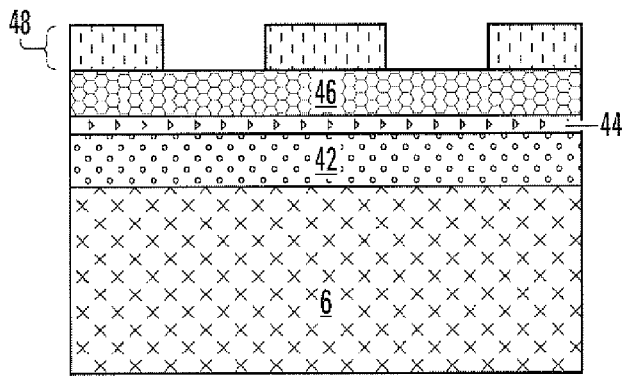
Figure 30D:
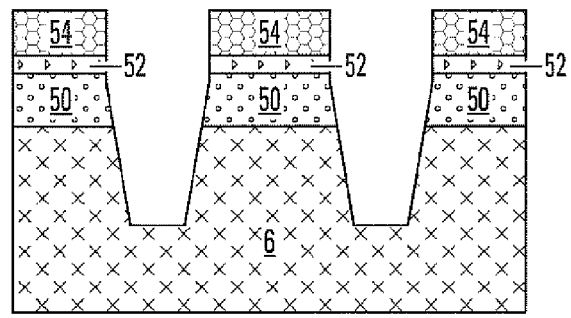
Figure 30E:
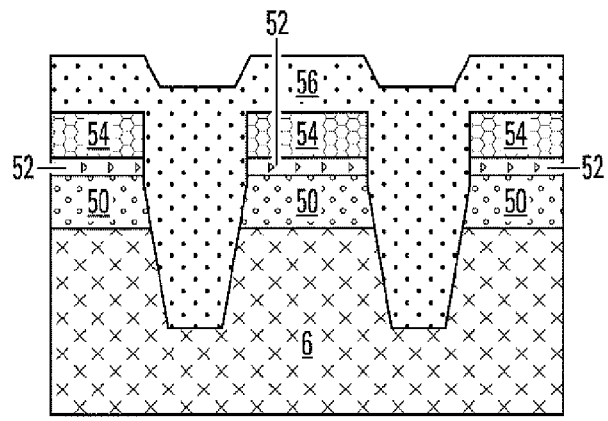
Figure 30F:
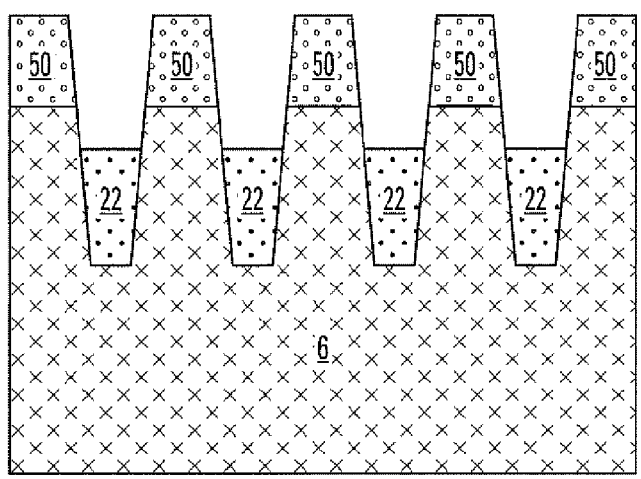
Figure 31A:
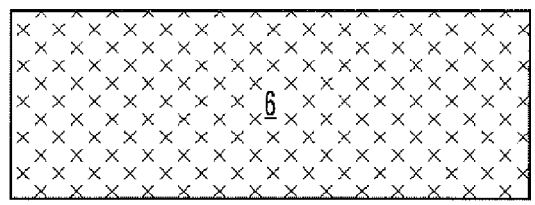
FIGS. 31A-31H illustrate a sample process flow for an array of gated diode nonvolatile memory cells with a diffusion barrier junction in the diode structures.
Figure 31B:
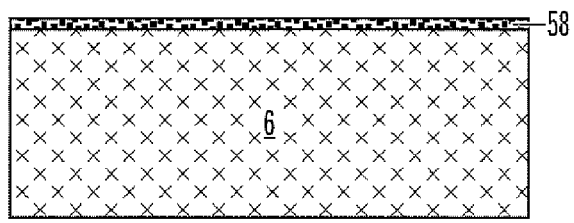
Figure 31C:
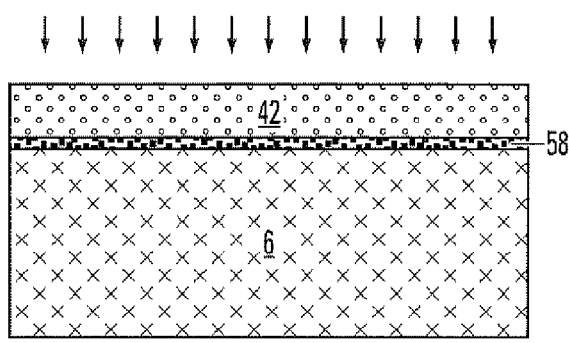
Figure 31D:
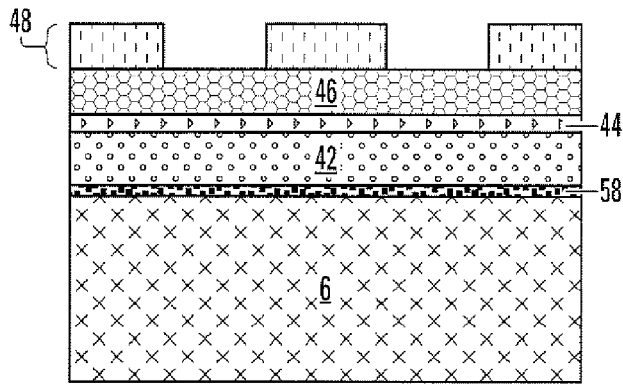
Figure 31E:
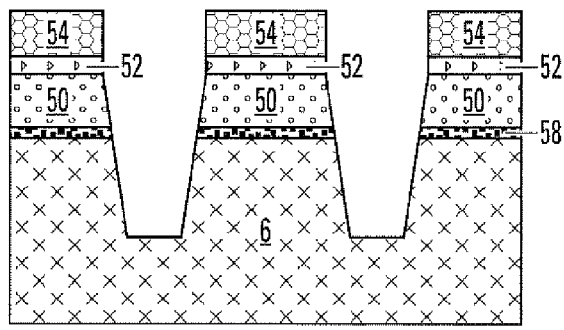
Figure 31F:
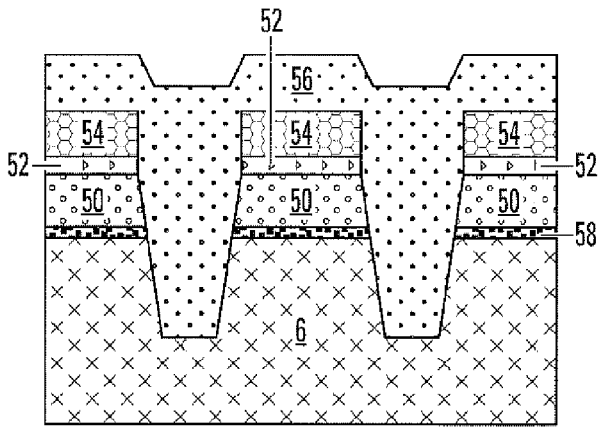
Figure 31G:
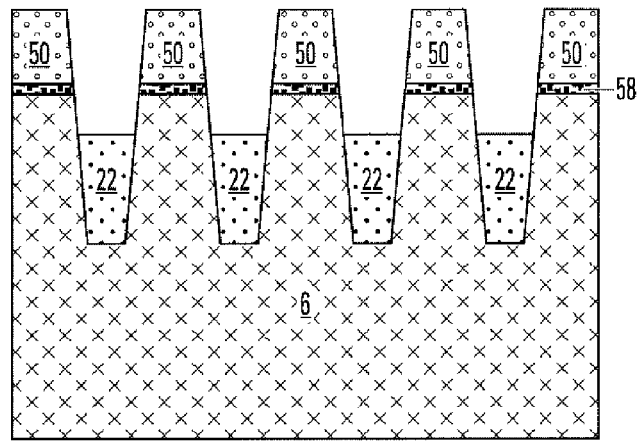
Figure 31H:
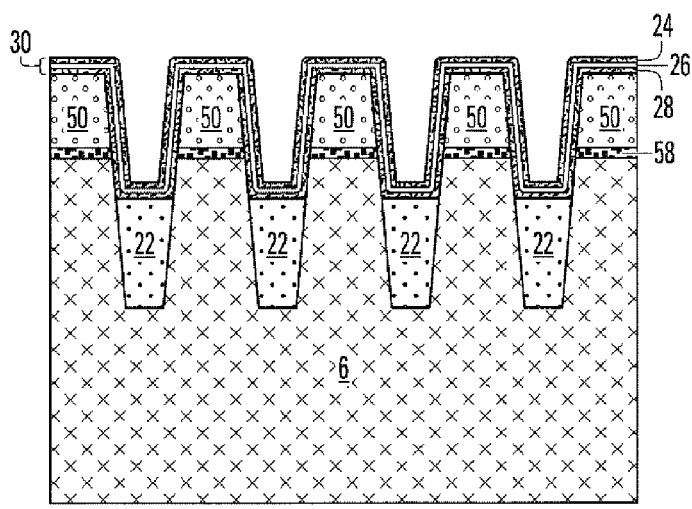
Figure 31I:
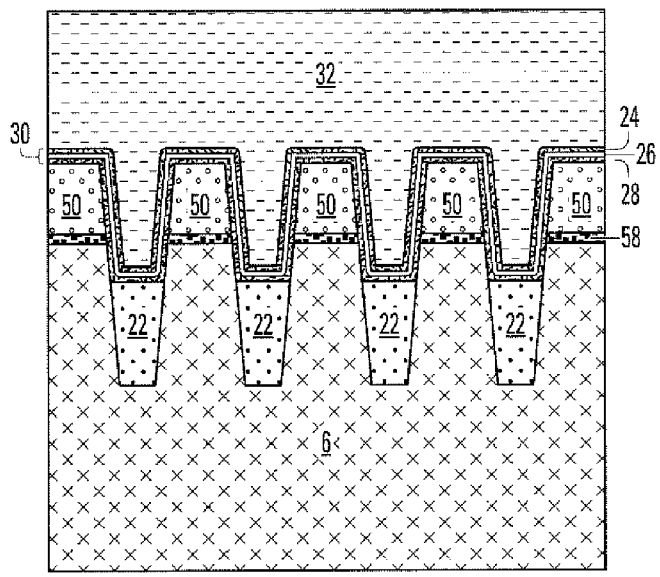

FIG. 30A shows a p-type substrate 6 with n-type poly deposition 40 being performed. FIG. 30B shows the resulting n+ poly film 42 over the p-type substrate 6. FIG. 30C shows the subsequently formed mask layer, with a layer of pad oxide 44 over the n+ poly film 42 and a layer of SiN 46 over the pad oxide 44. Photoresist layer 48 over the layer of SiN 46 is part of the photolithography process to form trenches. FIG. 30D shows the shallow trenches anisotropically formed on the substrate 6. The n+ poly film 42 has been divided by the trenches into discrete first diode nodes, with corresponding second diode nodes being the portion of the neighboring substrate 6. Similarly, pad oxide 44 is divided into discrete pad oxides 52 and SiN 46 is divided into discrete SiN 54. Photoresist layer 48 is removed. In FIG. 30E, isolation oxide 56 fills the trenches and isolates neighboring diode structures from each other. A chemical mechanical polishing process and SiN removal follow. FIG. 30F shows the partial removal of the isolation oxide, resulting in isolation oxide parts 22 which isolate neighboring diode structures from each other, by isolating parts of the neighboring second diode nodes from each other. The remainder of the process is similar to that shown in FIGS. 23G and 23H.

FIGS. 31A-31H illustrate a sample process flow for an array of gated diode nonvolatile memory cells with a diffusion barrier junction in the diode structures.

The process flow of FIGS. 31A-31H is similar to that of FIGS. 30A to 30F and FIGS. 23G and 23H, except that, prior to the formation of the n+ poly film 42 over the p-type substrate 6, an ultra thin film 58 is formed over the over the p-type substrate 6. Film 58 is in various embodiments an oxide, nitride, or oxynitride, with a thickness of about 10-20 Angstroms After the film 58 is divided into discrete sections, each discrete section is the diffusion barrier junction that helps to discourage the movement of dopants between the first and second diode nodes of each diode structure.

Figure 32:
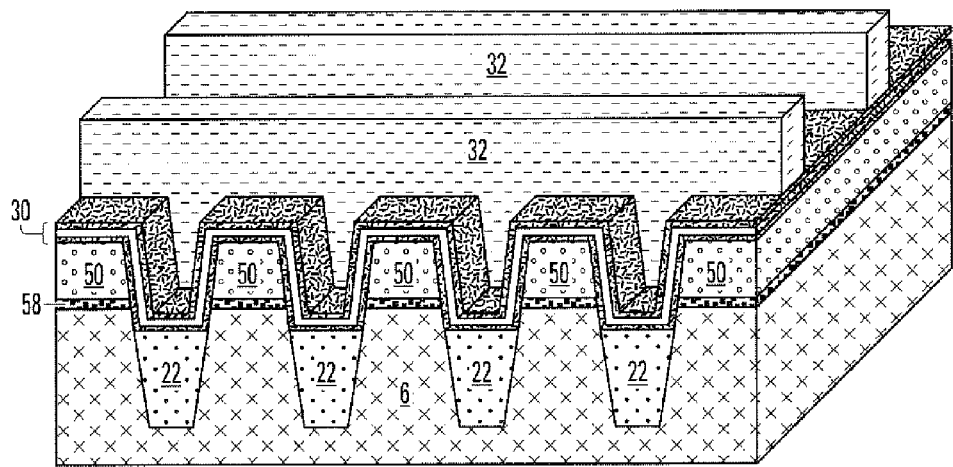
FIG. 32 is a perspective view of an array of gated diode nonvolatile memory cells with a diffusion barrier junction in the diode structures as formed by the process of FIGS. 31A-31H.

FIG. 32 is a perspective view of an array of gated diode nonvolatile memory cells with a diffusion barrier junction in the diode structures as formed by the process of FIGS. 31A-31H.

Figure 43A:
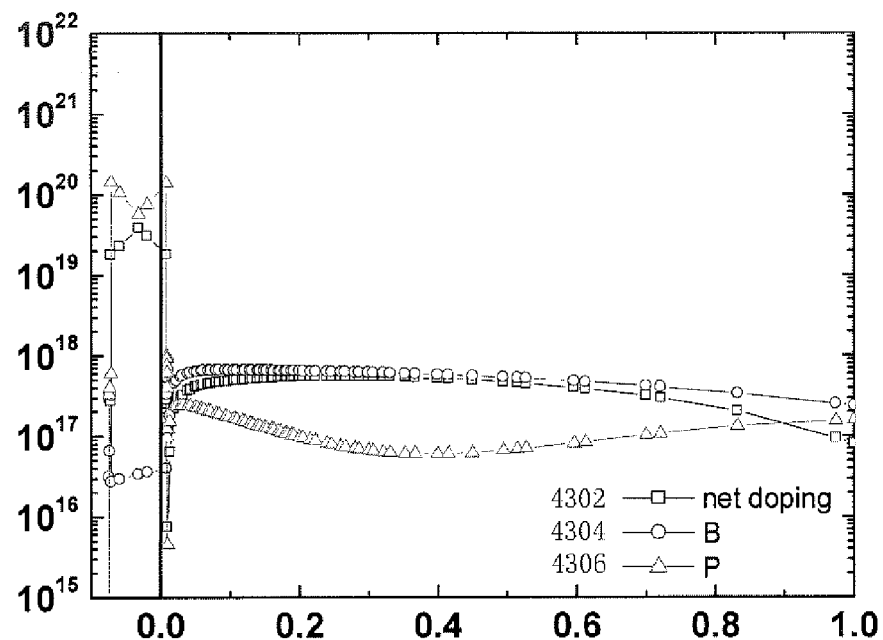
FIGS. 43A and 43B are graphs comparing the doping profiles of diode structures with and without a diffusion barrier junction.
Figure 43B:
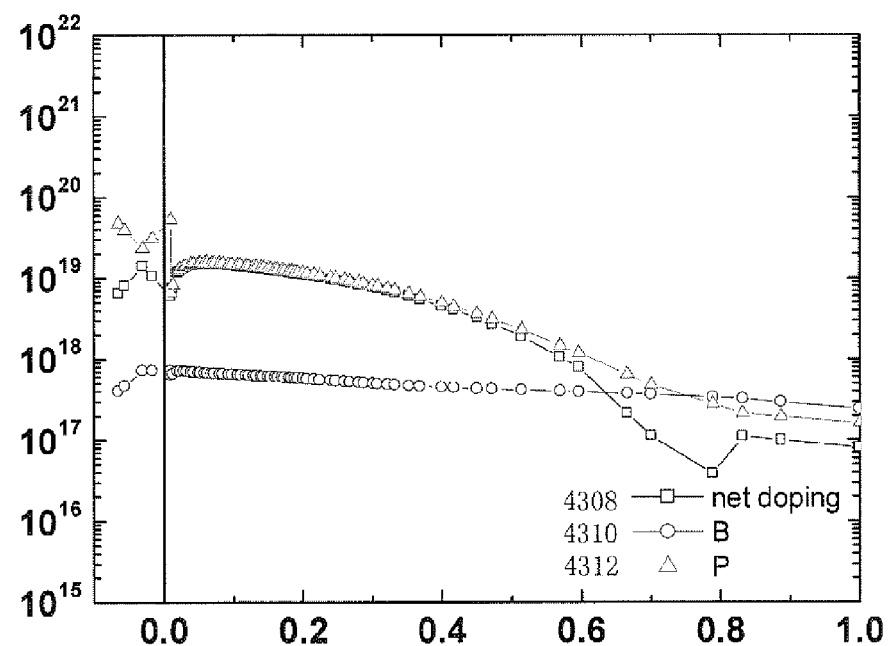

FIGS. 43A and 43B are graphs comparing the doping profiles of diode structures with and without a diffusion barrier junction.

FIG. 43A is graph showing the doping profiles of a diode structure with a diffusion harrier junction. Curves 4304 and 4306 respectively represent the doping profiles of p-type dopant boron and n-type dopant phosphorus. Curve 4302 represents the net doping profile of curves 4304 and 4306. The x-axis represents the vertical position in microns along the diode structure, such that the origin is the interface between the diffusion barrier junction and the second diode node, the positive x-axis direction goes deeper into the second diode node (and increasingly surrounded by isolation dielectric), and the negative x-axis direction goes deeper into the first diode node (and increasingly surrounded by charge storage structure and storage dielectric). The first diode node is n+ polysilicon doped $10^{20}$ cm$^{-3}$.

FIG. 43B is graph showing the doping profiles of a diode structure similar to that of FIG. 43A, but without a diffusion barrier junction. Curves 4310 and 4312 respectively represent the doping profiles of p-type dopant boron and n-type dopant phosphorus. Curve 4308 represents the net doping profile of curves 4304 and 4306. The following table compares the p-type boron doping concentration, the n-type phosphorus doping concentration, and the net doping type, at a depth in the second diode node corresponding to an x-axis value of x=0.1 um. The table indicates that the diffusion barrier junction helps to discourage the movement of n-type dopants in the first diode node from moving into the second diode node.

|  | FIG. 43A, w/diffusion barrier junction | FIG. 43B, w/o diffusion barrier junction |
| --- | --- | --- |
| p-type boron (cm$^{-3}$) | $6.58 \times 10^{17}$ | $6.42 \times 10^{17}$ |
| n-type phosphorus (cm$^{-3}$) | $1.66 \times 10^{17}$ | $1.47 \times 10^{19}$ |
| Net doping type of second diode node | p-type | n-type |

Figure 44A:
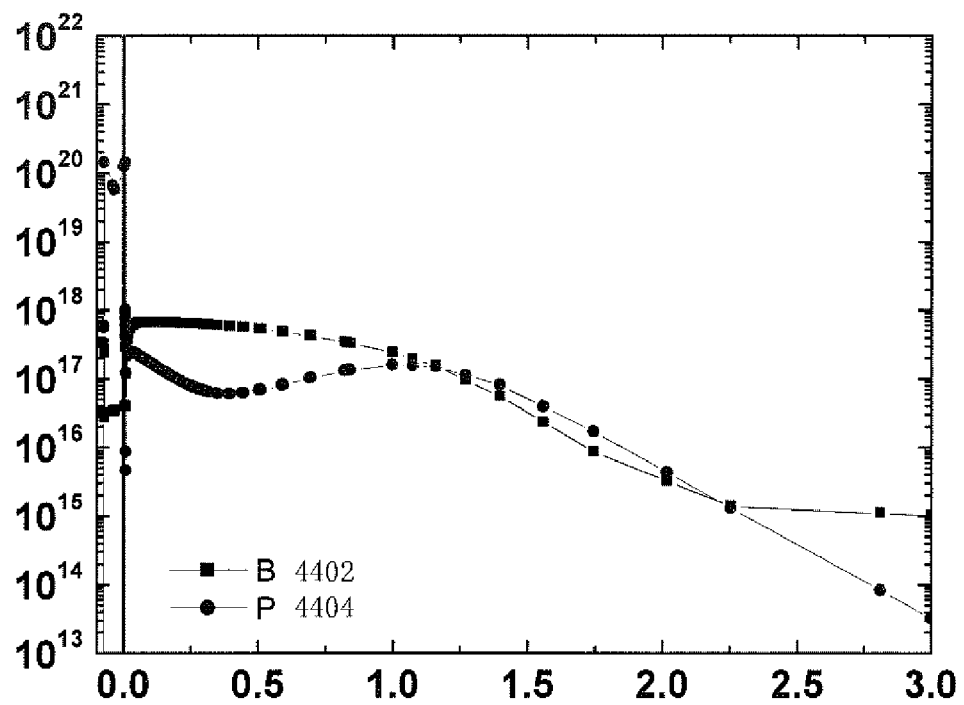
FIGS. 44A and 44B are graphs comparing the doping profiles of diode structures with and without a diffusion barrier junction, under different thermal budget conditions.
Figure 44B:
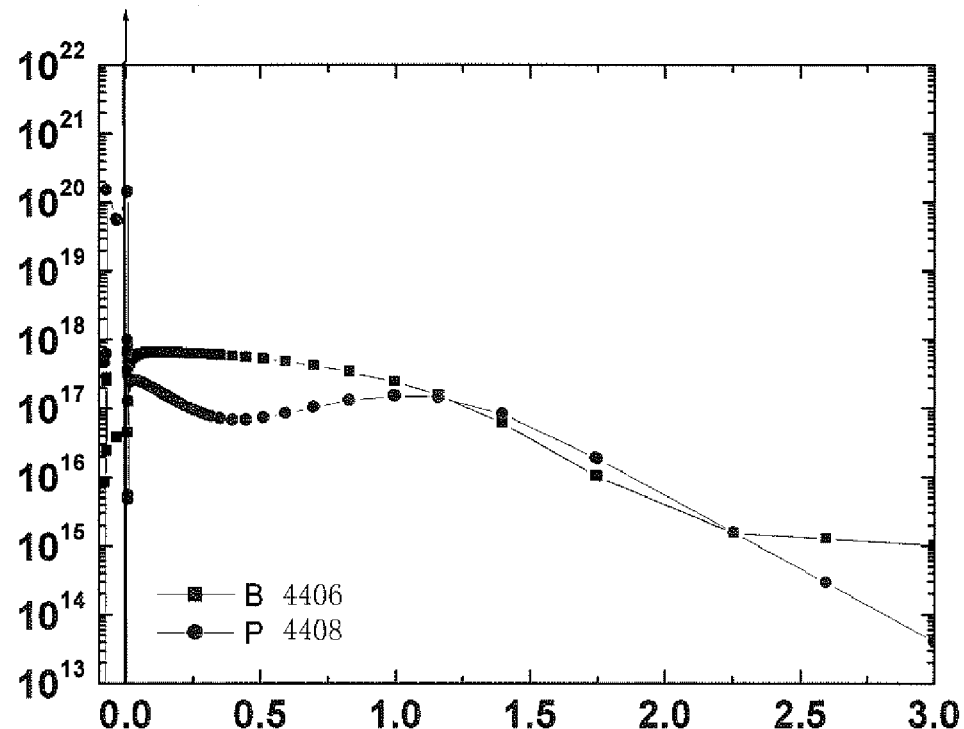

FIGS. 44A and 44B are graphs comparing the doping profiles of diode structures with and without a diffusion barrier junction, under different thermal budget conditions. In both FIGS. 44A and 44B, the diode structure has a 15 Angstrom thick diffusion barrier junction. The x-axis convention is the same as in FIGS. 43A and 43B. In FIG. 44A, curves 4402 and 4404 respectively represent the doping profiles of p-type dopant boron and n-type dopant phosphorus. In FIG. 44B, curves 4406 and 4408 respectively represent the doping profiles of p-type dopant boron and n-type dopant phosphorus. FIG. 44A corresponds to a relatively light thermal budget, with an ISSG (in situ steam generation) process at 900° C. for 21 seconds followed by an HTO (high temperature oxide) process at 900° C. for 30 minutes. FIG. 44B corresponds to a relatively heavy thermal budget, with a thermal process at 950° C. for 10 minutes followed by another thermal process at 1000° C. for 43.5 minutes. The respective doping profiles appear very similar between FIGS. 44A and 44B, despite the very different thermal budgets.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A method for making a nonvolatile memory device in an integrated circuit, the device including a diode having a first diode node and a second diode node, comprising:

forming a first layer of a first charge type of the integrated circuit above a second layer of a second charge type of the integrated circuit, wherein the first charge type is opposite to the second charge type;

removing part of the first layer and part of the second layer to form the first diode node in the first layer and to form the second diode node in the second layer, the first charge type of the first diode node being opposite to the second charge type of the second diode node, the first diode node and the second diode node separated by a junction;

forming isolation dielectric areas of the integrated circuit to isolate at least part of the second diode node of the device from neighboring devices, such that the isolation dielectric areas leave the junction uncovered;

forming a charge storage structure and one or more storage dielectric structures on the integrated circuit, the charge storage structure and the one or more storage dielectric structures covering at least the junction and parts of the first and second diode nodes adjacent to the junction, such that the one or more storage dielectric structures are at least partly between the charge storage structure and the first and second diode nodes, and the one or more storage dielectric structures are at least partly between the charge storage structure and a source of gate voltage of the device; and forming a gate supplying the gate voltage of the device.

2. The method of claim 1, wherein the charge storage structure has a charge storage state determined by a measurement of current flowing through the first diode node and the second diode node in reverse bias.

3. The method of claim 1, wherein said forming isolation dielectric areas includes:

covering at least the junction with the isolation dielectric areas; and removing at least the isolation dielectric areas covering the junction.

4. The method of claim 1, wherein the first diode node is a doped polysilicon.

5. The method of claim 1, wherein the second diode node is a well of the integrated circuit.

6. The method of claim 1, wherein the second diode node is a substrate of the integrated circuit.

7. The method of claim 1, wherein the first diode node is part of a bit line accessing the device.

8. The method of claim 1, wherein the diode formed by the first diode node and the second diode node is a Schottky diode.

9. The method of claim 1, wherein the diode formed by the first diode node and the second diode node is a pn diode.

10. The method of claim 1, wherein the junction is a homojunction.

11. The method of claim 1, wherein the junction is a heterojunction.

12. The method of claim 1, wherein the junction is a graded heterojunction.

13. The method of claim 1, wherein the junction includes a diffusion barrier junction.

14. The method of claim 1, wherein the charge storage structure includes charge trapping material.

15. The method of claim 1, wherein the charge storage structure includes floating gate material.

16. The method of claim 1, wherein the charge storage structure includes nanocrystal material.

17. The method of claim 1, wherein the first diode node and second diode node are at least one of monocrystal, polycrystal, and amorphous.

18. A nonvolatile memory device in an integrated circuit, the device including a diode having a first diode node and a second diode node, the device made by a process comprising:

forming a first layer of a first charge type of the integrated circuit above a second layer of a second charge type of the integrated circuit, wherein the first charge type is opposite to the second charge type;

removing part of the first layer and part of the second layer to form the first diode node in the first layer and to form the second diode node in the second layer, the first charge type of the first diode node being opposite to the second charge type of the second diode node, the first diode node and the second diode node separated by a junction;

forming isolation dielectric areas of the integrated circuit to isolate at least part of the second diode node of the device from neighboring devices, such that the isolation dielectric areas leave the junction uncovered;

forming a charge storage structure and one or more storage dielectric structures on the integrated circuit, the charge storage structure and the one or more storage dielectric structures covering at least the junction and parts of the first and second diode nodes adjacent to the junction, such that the one or more storage dielectric structures are at least partly between the charge storage structure and the first and second diode nodes, and the one or more storage dielectric structures are at least partly between the charge storage structure and a source of gate voltage of the device; and forming a gate supplying the gate voltage of the device.

19. The device of claim 18, wherein the charge storage structure has a charge storage state determined by a measurement of current flowing through the first diode node and the second diode node in reverse bias.

20. The device of claim 18, wherein the junction includes a diffusion barrier junction.

21. A method for making an array of nonvolatile memory devices in an integrated circuit, each of the devices including a diode having a first diode node and a second diode node, the method comprising:

forming a first layer of a first charge type of the integrated circuit above a second layer of a second charge type of the integrated circuit, wherein the first charge type is opposite to the second charge type;

removing part of the first layer and part of the second layer to form the first diode nodes in the first layer and to form the second diode nodes in the second layer, such that the devices each include an adjacent pair of the first diode node and the second diode node, the first diode node and the second diode node of each of the devices separated by a junction;

forming isolation dielectric columns of the integrated circuit to isolate at least part of the second diode node of each of the devices from neighboring columns of the devices, the junction of each of the devices being covered by the isolation dielectric columns;

forming a charge storage structure and one or more storage dielectric structures for each of the devices, the charge storage structure and the one or more storage dielectric structures covering at least the junction and parts of the first and second diode nodes adjacent to the junction, such that the one or more storage dielectric structures are at least partly between the charge storage structure and the first and second diode nodes, and the one or more storage dielectric structures are at least partly between the charge storage structure and a source of gate voltage of each of the devices; and forming word lines supplying the gate voltage to each of the devices of the integrated circuit.

22. The method of claim 21, wherein the first diode nodes are bit lines, the bit lines and the word lines accessing particular nonvolatile memory devices of the array of nonvolatile memory devices.

23. The method of claim 21, wherein the charge storage structure of each of the devices has a charge storage state determined by a measurement of current flowing through the first and second diode nodes in reverse bias.

24. The method of claim 21, wherein the junction of each of the devices includes a diffusion barrier junction.

25. An array of nonvolatile memory devices in an integrated circuit, each of the devices including a diode having a first diode node and a second diode node, the array made by a process comprising:

forming a first layer of a first charge type of the integrated circuit above a second layer of a second charge type of the integrated circuit, wherein the first charge type is opposite to the second charge type;

removing part of the first layer and part of the second layer to form the first diode nodes in the first layer and to form the second diode nodes in the second layer, such that the devices each include an adjacent pair of the first diode node and the second diode node, the first diode node and the second diode node of each of the devices separated by a junction;

forming isolation dielectric columns of the integrated circuit to isolate at least part of the second diode node of each of the devices from neighboring columns of the devices, the junction of each of the devices being covered by the isolation dielectric columns;

forming a charge storage structure and one or more storage dielectric structures for each of the devices, the charge storage structure and the one or more storage dielectric structures covering at least the junction and parts of the first and second diode nodes adjacent to the junction, such that the one or more storage dielectric structures are at least partly between the charge storage structure and the first and second diode nodes, and the one or more storage dielectric structures are at least partly between the charge storage structure and a source of gate voltage of each of the devices; and forming word lines supplying the gate voltage to each of the devices of the integrated circuit.

26. The array of claim 25, wherein the first diode nodes are bit lines, the bit lines and the word lines accessing particular nonvolatile memory devices of the array of nonvolatile memory devices.

27. The array of claim 25, wherein the charge storage structure of each of the devices has a charge storage state determined by a measurement of current flowing through the first and second diode nodes in reverse bias.

28. The array of claim 25, wherein the junction of each of the devices includes a diffusion barrier junction.

* * * * *